US 12,073,789 B2

(12) United States Patent
Toya et al.

(10) Patent No.: US 12,073,789 B2
(45) Date of Patent: *Aug. 27, 2024

(54) ELECTRO-OPTICAL DEVICE AND ELECTRONIC APPARATUS

(71) Applicant: SEIKO EPSON CORPORATION, Tokyo (JP)

(72) Inventors: Takashi Toya, Shimosuwa-machi (JP); Takehiko Kubota, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/206,196

(22) Filed: Jun. 6, 2023

(65) Prior Publication Data

US 2023/0317010 A1 Oct. 5, 2023

Related U.S. Application Data

(63) Continuation of application No. 17/859,318, filed on Jul. 7, 2022, now Pat. No. 11,710,454, which is a
(Continued)

(30) Foreign Application Priority Data

Apr. 3, 2012 (JP) .................................. 2012-084743

(51) Int. Cl.
*G09G 3/32* (2016.01)
*G09G 3/3208* (2016.01)
(Continued)

(52) U.S. Cl.
CPC ......... *G09G 3/3241* (2013.01); *G09G 3/3208* (2013.01); *G09G 3/3291* (2013.01);
(Continued)

(58) Field of Classification Search
CPC .. G09G 3/3241; G09G 3/3208; G09G 3/3291; G09G 3/3233; G09G 2300/0408;
(Continued)

(56) References Cited

U.S. PATENT DOCUMENTS 9,030,390 B2   5/2015   Toya et al.
9,361,830 B2   6/2016   Toya et al.
(Continued)

FOREIGN PATENT DOCUMENTS

CN   1744774 A      3/2006
JP   H11-231805 A   8/1999
(Continued)

OTHER PUBLICATIONS

Jul. 23, 2014 Office Action issued in U.S. Appl. No. 13/848,323.
(Continued)

*Primary Examiner* — Jennifer T Nguyen
(74) *Attorney, Agent, or Firm* — Oliff PLC

(57) ABSTRACT

An electro-optical device includes one or more control lines that include a scanning line, a data line and a pixel circuit. The pixel circuit has a drive transistor, a write-in transistor with a gate which is electrically connected to the scanning line, a light-emitting element that emits light at a brightness that depends on the size of a current that is supplied through the drive transistor, and a control line which overlaps the gate of the drive transistor when viewed from a direction that is perpendicular to a surface of a substrate on which the pixel circuit is formed is included in the one or more control lines.

8 Claims, 16 Drawing Sheets

Related U.S. Application Data continuation of application No. 17/168,421, filed on Feb. 5, 2021, now Pat. No. 11,423,838, which is a continuation of application No. 16/734,648, filed on Jan. 6, 2020, now Pat. No. 10,957,254, which is a continuation of application No. 15/629,452, filed on Jun. 21, 2017, now Pat. No. 10,553,157, which is a continuation of application No. 15/144,186, filed on May 2, 2016, now Pat. No. 9,721,506, which is a continuation of application No. 14/678,552, filed on Apr. 3, 2015, now Pat. No. 9,361,830, which is a continuation of application No. 13/848,323, filed on Mar. 21, 2013, now Pat. No. 9,030,390.

(51) Int. Cl.
*G09G 3/3241* (2016.01)
*G09G 3/3291* (2016.01)
*H01L 27/12* (2006.01)
*H10K 59/121* (2023.01)
*H10K 59/123* (2023.01)
*H10K 59/131* (2023.01)
*G09G 3/3233* (2016.01)

(52) U.S. Cl.
CPC ........ *H01L 27/124* (2013.01); *H01L 27/1255* (2013.01); *H10K 59/1213* (2023.02); *H10K 59/123* (2023.02); *H10K 59/131* (2023.02); *G09G 3/3233* (2013.01); *G09G 2300/0408* (2013.01); *G09G 2300/0439* (2013.01); *G09G 2300/0465* (2013.01); *G09G 2300/0861* (2013.01); *G09G 2310/0289* (2013.01); *G09G 2310/0297* (2013.01)

(58) Field of Classification Search
CPC ... G09G 2300/0439; G09G 2300/0465; G09G 2300/0861; G09G 2310/0289; G09G 2310/0297; H10K 59/131; H10K 59/1213; H10K 59/123
USPC ......................................................... 345/82
See application file for complete search history.

(56) References Cited

U.S. PATENT DOCUMENTS

| | | | |
|---|---|---|---|
| 9,721,506 B2 | 8/2017 | Toya et al. | |
| 10,957,254 B2 | 3/2021 | Toya et al. | |
| 11,710,454 B2* | 7/2023 | Toya ................ | H10K 59/1213 345/82 |
| 2005/0017929 A1 | 1/2005 | Sano et al. | |
| 2006/0055336 A1 | 3/2006 | Jeong | |
| 2006/0097261 A1 | 5/2006 | Yang | |
| 2006/0170634 A1 | 8/2006 | Kwak et al. | |
| 2006/0279478 A1 | 12/2006 | Ikegami | |
| 2007/0035485 A1 | 2/2007 | Yoon | |
| 2007/0200803 A1 | 8/2007 | Kimura | |
| 2007/0273619 A1 | 11/2007 | Kitazawa et al. | |
| 2008/0143653 A1 | 6/2008 | Shishido | |
| 2008/0150437 A1 | 6/2008 | Tida et al. | |
| 2009/0273547 A1 | 11/2009 | Tanikame et al. | |
| 2010/0007681 A1* | 1/2010 | Kubota ................ | G09G 3/3233 345/76 |
| 2010/0078643 A1 | 4/2010 | Kimura | |
| 2010/0252832 A1 | 10/2010 | Asano et al. | |
| 2010/0270678 A1 | 10/2010 | Keda et al. | |
| 2010/0302228 A1 | 12/2010 | Ishiguro et al. | |
| 2010/0328364 A1 | 12/2010 | Kubota | |
| 2011/0108844 A1 | 5/2011 | Kwak et al. | |
| 2011/0157506 A1* | 6/2011 | Eguchi ............. | G02F 1/133553 349/39 |
| 2011/0193836 A1 | 8/2011 | Umezaki | |
| 2012/0127220 A1 | 5/2012 | Noguchi | |
| 2012/0306729 A1 | 12/2012 | Tomida et al. | |
| 2013/0050067 A1 | 2/2013 | Yamashita et al. | |
| 2013/0093737 A1 | 4/2013 | Ota et al. | |
| 2015/0235592 A1 | 8/2015 | Yamashita et al. | |
| 2017/0148386 A1 | 5/2017 | Yamashita et al. | |
| 2018/0261156 A1 | 9/2018 | Yamashita et al. | |

FOREIGN PATENT DOCUMENTS

| | | |
|---|---|---|
| JP | 2002-196701 A | 7/2002 |
| JP | 2007-017936 A | 1/2007 |
| JP | 2007-058186 A | 3/2007 |
| JP | 2007-256881 A | 10/2007 |
| JP | 2007-316462 A | 12/2007 |
| JP | 2007-316510 A | 12/2007 |
| JP | 2008-305860 A | 12/2008 |
| JP | 2009-014796 A | 1/2009 |
| JP | 2009-075194 A | 4/2009 |
| JP | 2010-19951 A | 1/2010 |
| JP | 2010-079159 A | 4/2010 |
| JP | 2010-117399 A | 5/2010 |
| JP | 2010-276903 A | 12/2010 |
| JP | 2010272845 | 12/2010 |
| JP | 2011-008053 A | 1/2011 |
| JP | 2011-044417 A | 3/2011 |
| JP | 2011-114346 A | 6/2011 |
| JP | 2011-180587 A | 9/2011 |
| JP | 2013-044890 A | 3/2013 |
| KR | 10-2009-0065645 A | 6/2009 |

OTHER PUBLICATIONS

Feb. 3, 2015 Notice of Allowance issued in U.S. Appl. No. 13/848,323.
Sep. 11, 2015 Office Action issued in U.S. Appl. No. 14/678,552.
Mar. 11, 2016 Notice of Allowance issued in U.S. Appl. No. 14/678,552.
Apr. 25, 2016 Notice of Allowance issued in U.S. Appl. No. 14/678,552.
Sep. 21, 2016 Office Action issued U.S. Appl. No. 15/144,186.

* cited by examiner

FIG. 9A
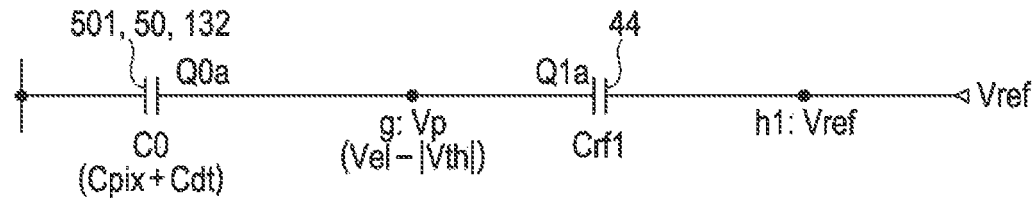
$$V_{gate} = \frac{Crf1}{(Crf1+C0)}\{Vh-Vref\}+Vp$$
$$= k1*\{Vh-Vref\}+Vp$$
$$\Delta Vg = k1*\Delta Vh$$
FIG. 9B
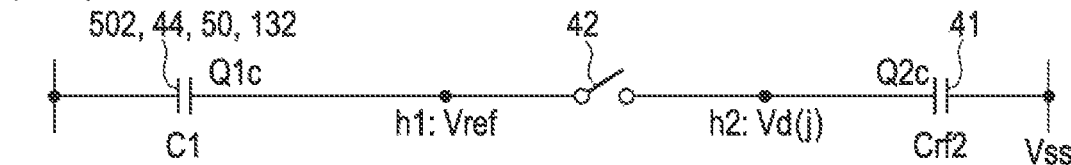
$$= \frac{C0*Crf1}{(C0+Crf1)}$$
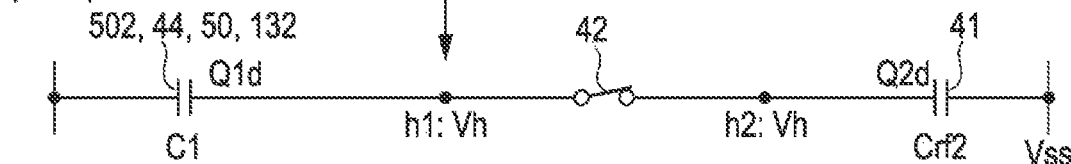
$$Vh = \frac{Crf2}{(C1+Crf2)}Vd(j) + \frac{C1}{(C1+Crf2)}Vref$$
$$\Delta Vh = \frac{Crf2}{(C1+Crf2)}\{Vd(j)-Vref\}$$
$$= k2*\{Vd(j)-Vref\}$$

ELECTRO-OPTICAL DEVICE AND ELECTRONIC APPARATUS

This is a Continuation of application Ser. No. 17/859,318 filed Jul. 7, 2022, which is a Continuation of application Ser. No. 17/168,421 filed Feb. 5, 2021, which is a Continuation of application Ser. No. 16/734,648 filed Jan. 6, 2020, which is a Continuation of application Ser. No. 15/629,452, filed Jun. 21, 2017, which is a Continuation of application Ser. No. 15/144,186, filed May 2, 2016, which is a Continuation of application Ser. No. 14/678,552, filed Apr. 3, 2015, which is a Continuation of application Ser. No. 13/848,323 filed Mar. 21, 2013, which claims priority of Japanese Patent Application No. 2012-084743, filed Apr. 3, 2012. The disclosures of the prior applications are hereby incorporated by reference herein in their entirety.

BACKGROUND

1. Technical Field

The present invention relates to an electro-optical device and an electronic apparatus.

2. Related Art

In recent years, various types of electro-optical devices that display images using light-emitting elements such as organic light-emitting diode (hereinafter referred to as "OLED") elements have been proposed. In such electro-optical devices, pixel circuits that include light-emitting elements, transistors and the like are provided to correspond to the pixels of images that are to be displayed. More specifically, a configuration in which, in addition to a plurality of pixel circuits that correspond to the pixels of images that are to be displayed being provided in matrix form, a control line such as a scanning line is provided in each row in order to drive the plurality of pixel circuits, is common (for example, refer to JP-A-2007-316462).

SUMMARY

However, in recent years, there are many cases in which a smaller display size and a higher definition of display is required in electro-optical devices. In such cases, a control line with a narrower pitch is necessary in order to dispose pixel circuits at high density.

An advantage of some aspects of the invention is that it is possible to realize a high density wiring of a plurality of control lines that include a plurality of scanning lines and to realize a higher definition of display or a smaller display size.

In order solve the abovementioned problem, according to an aspect of the invention, there is provided an electro-optical device which is provided with a scanning line, a data line that intersects the scanning line and a pixel circuit that is provided to correspond to the intersection of the scanning line and the data line, in which the pixel circuit has a drive transistor, a write-in transistor with a gate which is electrically connected to the scanning line, a first storage capacity that stores a charge that depends on a data signal that is supplied through the data line and the write-in transistor, and a light-emitting element that emits light at a brightness that depends on the size of a current that is supplied through the drive transistor, and the scanning line and the gate of the drive transistor overlap when viewed from a direction that is perpendicular to a surface of a substrate on which the pixel circuit is formed.

According to this aspect of the invention, since the scanning line is wired on the gate of the drive transistor, in comparison with a case in which the scanning line is wired not to intersect the gate of the drive transistor, the restrictions on space can be relaxed when providing the scanning line. As a result of this configuration, a scanning line with a narrower pitch and higher density of wiring are possible. That is, according to the aspect of the invention, it is possible to dispose a plurality of pixel circuits at a higher density, and a higher definition of display and a smaller display size are possible. Additionally, in the aspect of the invention, the write-in transistor may, for example, be electrically connected between the gate of the drive transistor and the data line.

In addition, the electro-optical device according to the aspect of the invention is provided with one or more control lines that include a scanning line, a data line that intersects the scanning line and a pixel circuit that is provided to correspond to the intersection of the scanning line and the data line, the pixel circuit has a drive transistor, a write-in transistor with a gate which is electrically connected to the scanning line, a first storage capacity that stores a charge that depends on a data signal that is supplied through the data line and the write-in transistor, and a light-emitting element that emits light at a brightness that depends on the size of a current that is supplied through the drive transistor, and a control line which overlaps the gate of the drive transistor when viewed from a direction that is perpendicular to a surface of a substrate on which the pixel circuit is formed is included in the one or more control lines.

According to this aspect of the invention, since the control line is wired on the gate of the drive transistor, in comparison with a case in which the control line is wired not to intersect the gate of the drive transistor, the restrictions on space can be relaxed when providing the control line. As a result of this configuration, a control line with a narrower pitch and higher density of wiring are possible. That is, according to the aspect of the invention, it is possible to dispose a plurality of pixel circuits at a higher density, and a higher definition of display and a smaller display size are possible.

In addition, it is preferable that the abovementioned electro-optical device be further provided with a scanning line drive circuit that controls the operation of the pixel circuit, the write-in transistor is turned on in a case in which the scanning line drive circuit supplies a first potential to the scanning line and is turned off in a case in which the scanning line drive circuit supplies a second potential to the scanning line, the scanning line and the gate of the drive transistor overlap when viewed from a direction that is perpendicular to a surface of a substrate on which the pixel circuit is formed, and when the scanning line drive circuit sets a period in which the potential that is supplied to the scanning line switches from the second potential to the first potential as a first switching period, and the scanning line drive circuit sets a period in which the potential that is supplied to the scanning line switches from the first potential to the second potential as a second switching period, it is preferable that the duration of the second switching period be longer than the duration of the first switching period.

In a case in which the gate of the drive transistor and the scanning line intersect in a plan view, the capacity is leeched between the gate of the drive transistor and the scanning line. Further, in a case in which the potential of the scanning line fluctuates rapidly, the fluctuation in potential affects the gate of the drive transistor and the potential of the gate of the drive transistor changes.

The drive transistor supplies a current of a size that depends on the voltage between a determined gate and source to the light-emitting element when the write-in transistor is turned off, and the light-emitting element emits light at a brightness that depends on the size of the current. Therefore, if the potential of the gate of the drive transistor changes when the write-in transistor is turned off (that is, after the write-in transistor has been established as a voltage that defines the brightness of the light-emitting element), the light-emitting element emits light at a brightness that is different from the defined brightness, and the display quality of the electro-optical device is reduced.

In contrast to this, the scanning line drive circuit according to an aspect of the invention causes the change in potential of the scanning line when the write-in transistor is turned off to change gradually in comparison with the change in potential when the write-in transistor is turned on. According to this configuration, the fluctuation in the potential of the scanning line when the write-in transistor is turned off prevents propagation to the gate of the drive transistor, and it is possible for the light-emitting element to emit light at a defined brightness. That is, according to the electro-optical device of the aspect of the invention, it is possible to realize a control line with a narrower pitch without causing a deterioration in display integrity.

In addition, the pixel circuit may be provided with a first switching transistor that is electrically connected between the gate and the drain of the drive transistor, and the one or more control lines may include a first control line that is electrically connected to the gate of the first switching transistor.

In such a case, it is preferable that the first switching transistor be turned on in a case in which the scanning line drive circuit supplies a first potential to the first control line, turned off in a case in which the scanning line drive circuit supplies a second potential to the first control line, the first control line and the gate of the drive transistor overlap when viewed from a direction that is perpendicular to a surface of a substrate on which the pixel circuit is formed, and if the scanning line drive circuit sets a period in which the potential that is supplied to first control line switches from the second potential to the first potential as a third switching period, and the scanning line drive circuit sets a period in which the potential that is supplied to the first control line switches from the first potential to the second potential as a fourth switching period, it is preferable that the duration of the fourth switching period be longer than the duration of the third switching period.

In a case in which the gate of the drive transistor and the first switching transistor intersect in a plan view, the capacity is leeched between the gate of the drive transistor and the first control line. Further, in a case in which the potential of the first control line fluctuates rapidly, the fluctuation in potential affects the gate of the drive transistor and the potential of the gate of the drive transistor changes.

Incidentally, in a case in which the first switching transistor is turned on, the gate of the drive transistor and the source thereof are electrically connected, and the voltage between the gate and source of the drive transistor is established as a value that compensates for variation in the threshold voltage of each pixel circuit. Therefore, if the potential of the gate of the drive transistor changes when the first switching transistor is turned off (that is, after threshold compensation has been performed), it is no longer possible to compensate for variation in the threshold voltage of the drive transistor of each pixel circuit, and display uniformity is lost.

In contrast to this, the scanning line drive circuit according to this aspect causes the change in potential of the first control line when the first switching transistor is turned off to change gradually in comparison with the change in potential when the write-in transistor is turned on. According to this configuration, the fluctuation in the potential of the first control line when the first switching transistor is turned off prevents propagation to the gate of the drive transistor, and prevents the potential of the gate of the drive transistor from changing from the potential at which threshold compensation is performed. That is, according to the electro-optical device of the invention, since it is even possible to prevent the occurrence or the like of display unevenness like the impairment of display uniformity in a case in which the first control line is disposed on the gate of the drive transistor, both a smaller electro-optical device and higher definition of display, and a high integrity display are possible.

In addition, the pixel circuit may be provided with a second switching transistor that is electrically connected between the drive transistor and the light-emitting element, and the one or more control lines may include a second control line that is electrically connected to the gate of the second switching transistor.

In such a case, it is preferable that the second switching transistor be turned on in a case in which the scanning line drive circuit supplies a first potential to the second control line, turned off in a case in which the scanning line drive circuit supplies a second potential to the second control line, the second control line and the gate of the drive transistor overlap when viewed from a direction that is perpendicular to a surface of a substrate on which the pixel circuit is formed, and if the scanning line drive circuit sets a period in which the potential that is supplied to second control line switches from the second potential to the first potential as a fifth switching period, and the scanning line drive circuit sets a period in which the potential that is supplied to the second control line switches from the first potential to the second potential as a sixth switching period, it is preferable that the duration of the fifth switching period be longer than the duration of the sixth switching period.

According to this aspect, it is possible for the fluctuation in the potential of the second control line when the second switching transistor is turned on to prevent propagation to the gate of the drive transistor. According to this configuration, it is possible to realize a control line with a narrower pitch without causing a deterioration in display integrity.

In addition, the pixel circuit may be provided with a third switching transistor that is electrically connected between a feed line that is supplied with a predetermined reset potential and the light-emitting element, and the one or more control lines may include a third control line that is electrically connected to the gate of the third switching transistor.

In such a case, it is preferable that the third switching transistor be turned on in a case in which the scanning line drive circuit supplies a first potential to the third control line, turned off in a case in which the scanning line drive circuit supplies a second potential to the third control line, the third control line and the gate of the drive transistor overlap when viewed from a direction that is perpendicular to a surface of a substrate on which the pixel circuit is formed, and when the scanning line drive circuit sets a period in which the potential that is supplied to the third control line switches from the second potential to the first potential as a seventh switching period, and the scanning line drive circuit sets a period in which the potential that is supplied to the third control line switches from the first potential to the second potential as an eighth switching period, it is preferable that the duration of the eighth switching period be longer than the duration of the seventh switching period.

According to this aspect, it is possible for the fluctuation in the potential of the third control line when the third switching transistor is turned off to prevent propagation to the gate of the drive transistor. According to this configuration, it is possible to realize a control line with a narrower pitch without causing a deterioration in display integrity.

In addition, it is preferable that the abovementioned electro-optical device be provided with a data line drive circuit that is electrically connected to the data line, a control circuit that controls the operations of the scanning line drive circuit and the data line drive circuit, and a second storage capacity that is provided to correspond to the data line and stores the potential of the data line, the data line drive circuit be provided with a first potential line to which a predetermined initial potential is supplied from the control circuit, a second potential line to which a reference potential is supplied from the control circuit and a level shift circuit which is provided to correspond to the data line, the level shift circuit be provided with a third storage capacity, a first electrode of which is electrically connected to the data line, a first transistor which is electrically connected between the first electrode of the third storage capacity and the first potential line and a second transistor which is electrically connected between the second electrode of the third storage capacity and second potential line, the control circuit maintain the first transistor in an on state in a first period, the scanning line drive circuit maintain the write-in transistor in an on state and the control circuit maintain the second transistor in an on state in addition to maintaining the first transistor in an off state in a second period that starts after the first period has finished, and the scanning line drive circuit maintain the write-in transistor in an on state, the control circuit maintain the first transistor and the second transistor in an off state and the second electrode of the third storage capacity be supplied with a potential on the basis of an image signal that defines the brightness of the light-emitting element in a third period that starts after the second period has finished.

According to this aspect of the invention, the data line is connected to the second storage capacity and the third storage capacity, and the second electrode of the third storage capacity supplies a potential on the basis of an image signal that defines the brightness of the light-emitting element. Therefore, the width of a fluctuation in the potential of the data line becomes a width of the fluctuation in the potential that is supplied to the second electrode of the third storage capacity that is compressed depending on the capacity ratio of the second storage capacity and the third storage capacity. That is, the range of the fluctuation in the potential of the data line is narrowed in comparison with the range of the fluctuation of the potential based on the image signal. As a result of this, it is even possible to set the potential of the gate of the drive transistor with a fine degree of accuracy when the image signal is not recorded with a fine degree of accuracy. Therefore, it is possible to supply a current to the light-emitting element with a high degree of accuracy, and a high integrity display is possible. In addition, since it is possible to suppress the width of the change in potential of the data line to be small, it is possible to prevent the occurrence of crosstalk, unevenness and the like that are caused by fluctuations in the potential of the data line.

Additionally, the electro-optical device according to the aspect of the invention determines the potential of the gate of the drive transistor by supplying a charge to the first storage capacity and the second storage capacity through the data line from the first electrode of the third storage capacity. More specifically, the potential of the gate of the drive transistor is decided by the capacitance value of the first storage capacity, the capacitance value of the second storage capacity and the quantity of the charge that the third storage capacity supplies to the first storage capacity and the second storage capacity. In a hypothetical case in which the electro-optical device is not provided with the second storage capacity, the potential of the gate of the drive transistor is decided by the capacitance value of the first storage capacity and the charge that the third storage capacity supplies. Accordingly, in a case in which the capacitance value of the first storage capacity has relative variation between each pixel circuit caused by accidental errors in the semiconductor process thereof, the potential of the gate of the drive transistor also has variation in each pixel circuit thereof. In such a case, display unevenness occurs and the display quality is reduced.

In contrast to this, an aspect of the invention is provided with a second storage capacity that stores the potential of the data line. Since the second storage capacity is provided to correspond to each data line, in comparison with the first storage capacity that is provided inside the pixel circuit, it is possible to configure the second storage capacity to have an electrode with a large area. Therefore, in comparison with the first storage capacity, the second storage capacity has less relative variation in capacitance value caused by accidental errors in the semiconductor process thereof. According to this configuration, it is possible to prevent variation in the potential in each pixel circuit of the gate of the drive transistor, and a high integrity display in which the occurrence of display unevenness is prevented is possible.

In addition, it is preferable that the level shift circuit be provided with a fourth storage capacity, a potential that shows the image signal be supplied to the first electrode of the fourth storage capacity in at least a portion of a period from the start of the first period to the start of the third period, and the first electrode of the fourth storage capacity be electrically connected to the second electrode of the third storage capacity in the third period.

According to this aspect of the invention, the image signal is supplied to the first electrode of the fourth storage capacity in the first period and the second period, and in addition to being stored temporarily, the image signal is supplied to the gate of the drive transistor through the third storage capacity in the third period.

In a hypothetical case in which the electro-optical device is not provided with the fourth storage capacity, all of the operations that supply a potential that shows the image signal to the gate of the drive transistor have to be performed in the third period, and it is necessary set the third period to be sufficiently long.

In contrast to this, since in an aspect of the invention, an image signal supply operation and a data line or the like initialization operation are performed in parallel in the first period and the second period, it is possible to relax the restrictions on time of the operations that are to be executed in a single horizontal scan period. According to this configuration, in addition to a reduction in the speed of the image signal supply operation being possible, it is possible to sufficiently secure a period in which the initialization of the data line or the like is performed.

In addition, according to this aspect of the invention, since the size of the fluctuation in potential based on the image signal is compressed using the fourth storage capacity in addition to the first storage capacity, the second storage capacity and the third storage capacity, it is possible to supply a current to the light-emitting element with a fine degree of accuracy.

In addition, it is preferable that the scanning line drive circuit maintain the first switching transistor in an on state in the second period, maintain the first switching transistor in an off state in periods other than the second period, and maintain the second switching transistor in an off state in addition to maintaining the third switching transistor in an on state in the first period, the second period and the third period.

According to this aspect of the invention, it is possible to set the potential of the gate of the drive transistor to a potential that corresponds to the threshold voltage of the drive transistor by setting the first switching transistor to an on state in the second period, and it is possible to compensate for variation in the threshold voltage of the drive transistor of each pixel circuit.

In addition, according to this aspect of the invention, it is possible to suppress the effect of the stored voltage of the capacity that leeches to the light-emitting element by setting the third switching transistor to an on state in the first period to the third period.

Additionally, in addition to an electro-optical device, it is possible for an aspect of the invention to be an electronic apparatus that has the electro-optical device. Examples of the electronic apparatus typically include display devices such as head-mounted displays (HMDs) and electronic viewfinders.

BRIEF DESCRIPTION OF THE DRAWINGS

The invention will be described with reference to the accompanying drawings, wherein like numbers reference like elements.

FIGS. 9A and 9B are views that describe changes in the potentials of gate nodes of the same electro-optical device.

FIG. 16 is a perspective view that shows an HMD that uses the electro-optical device according to the embodiment and the like.

DESCRIPTION OF EXEMPLARY EMBODIMENTS

Hereinafter, embodiments of the invention will be described with reference to the drawings.

EMBODIMENT

Figure 1:
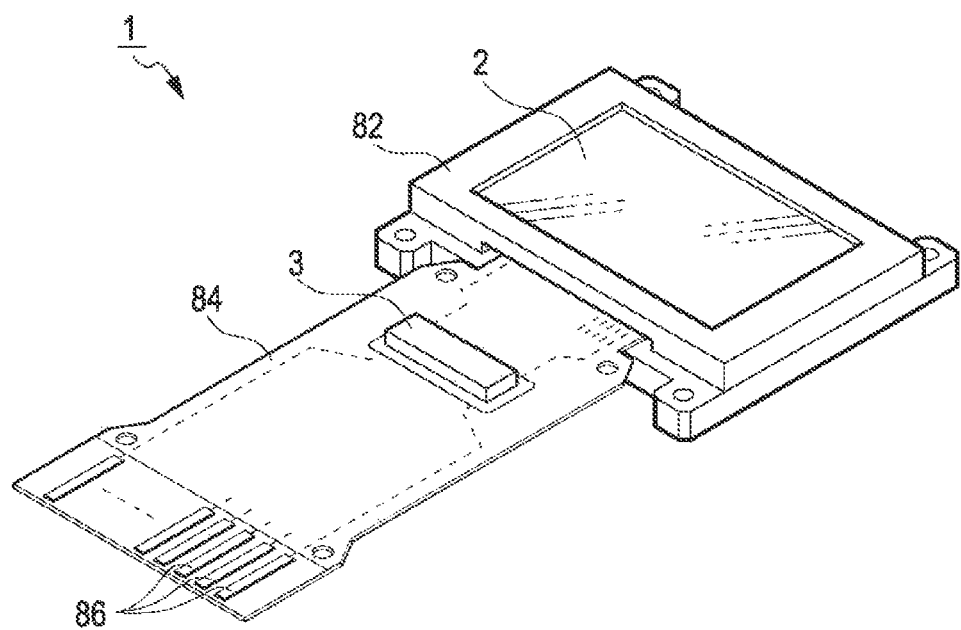
FIG. 1 is a perspective view that shows the configuration of an electro-optical device according to an embodiment of the invention.

FIG. 1 is a perspective view that shows the configuration of an electro-optical device 1 according to an embodiment of the invention. The electro-optical device 1 is for example, a micro display that displays images in a head-mounted display.

As shown in FIG. 1, the electro-optical device 1 is provided with a display panel 2 and a control circuit 3 that controls the operation of the display panel 2. The display panel 2 is provided with a plurality of pixel circuits and a drive circuit that drives the pixel circuits. In the present embodiment, the plurality of pixel circuits and the drive circuit that the display panel 2 is provided with are formed on a silicon substrate and an OLED, which is an example of a light-emitting element is used in the pixel circuits. In addition, the display panel 2 is for example, connected to a terminal of an FPC (Flexible Printed Circuit) substrate 84 in addition to being accommodated in a frame-like case 82 that is open in a display section thereof.

In addition to a semiconductor chip control circuit 3 being mounted in the FPC substrate 84 using COF (Chip On Film) technology, a plurality of terminals 86 are provided and connected to an upper level circuit that is not shown in the drawing.

Figure 2:
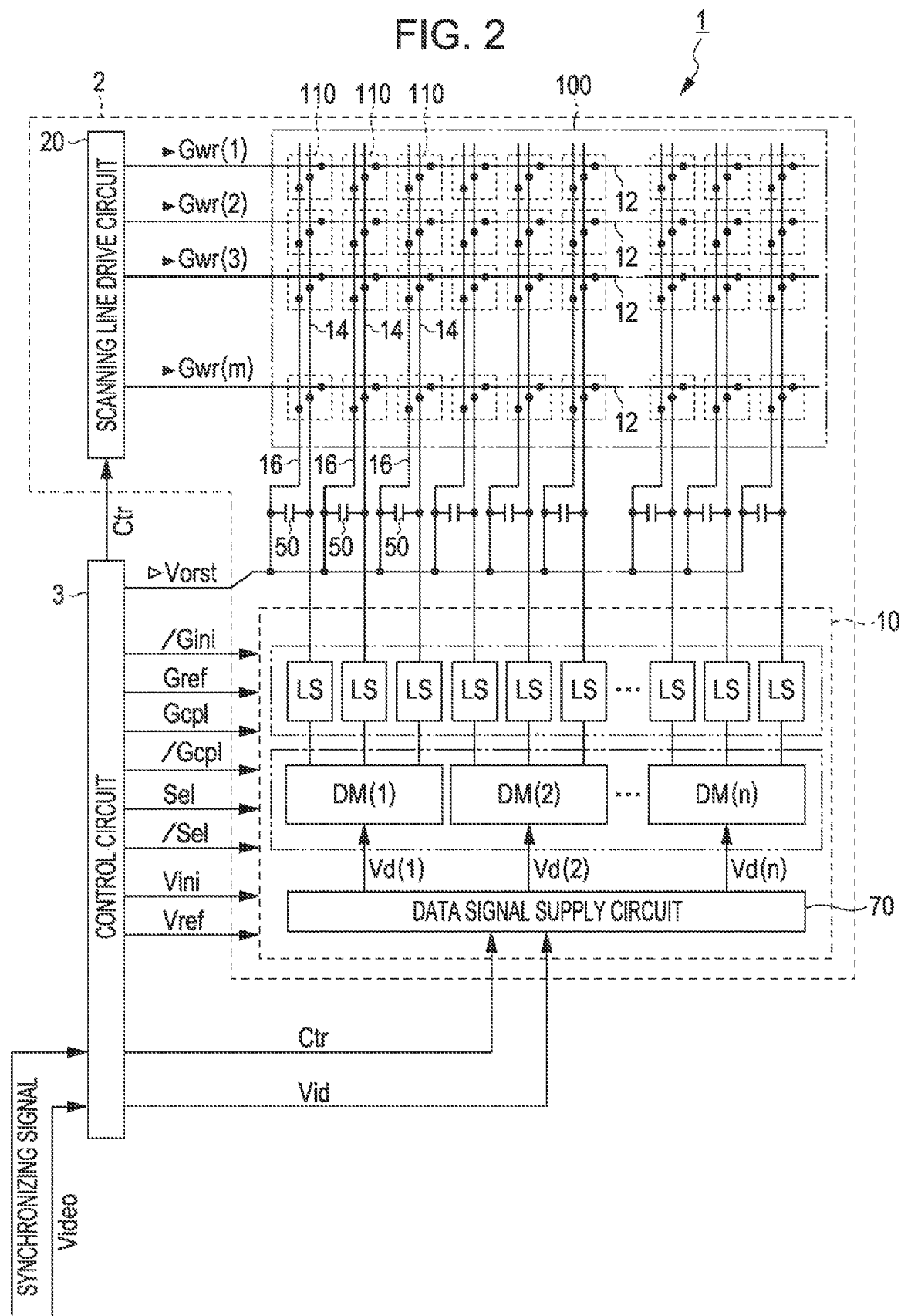
FIG. 2 is a view that shows the configuration of the same electro-optical device.

FIG. 2 is a block view that shows the configuration of the electro-optical device 1 according to the embodiment. As described above, the electro-optical device 1 is provided with a display panel 2 and a control circuit 3.

Digital image data Video is supplied from the upper level circuit that is not shown in the drawing to the control circuit 3 in synchronization with a synchronizing signal. In this case, the image data Video is for example, data that defines the gradation level of the pixels of an image that is to be displayed on the display panel 2 (strictly speaking, a display section 100 that will be described later) in 8 bits. In addition, the synchronizing signal is a signal that includes a vertical synchronizing signal, a horizontal synchronizing signal and a dot clock signal.

The control circuit 3 generates various control signals and supplies the foregoing to the display panel 2 on the basis of the synchronizing signal. More specifically, the control circuit 3 supplies a control signal Ctr, a negative logic control signal /Gini, a positive logic control signal Gref, a positive logic control signal Gcpl, a negative logic control signal /Gcpl that has a logically inverted relationship with the positive logic control signal Gcpl, control signals Sel (1), Sel (2) and Sel (3), and control signals /Sel (1), /Sel (2) and /Sel (3) that have logically inverted relationships with the control signals Sel (1), Sel (2) and Sel (3) to the display panel 2. In this case, the control signal Ctr is a signal that includes a plurality of signals such as a pulse signal, a clock signal and an enable signal. Additionally, there are cases in which the control signals Sel (1), Sel (2) and Sel (3) are referred to as a control signal Sel and those in which the control signals /Sel (1), /Sel (2) and /Sel (3) are referred to as a control signal/Sel.

In addition, the control circuit 3 supplies various potentials to the display panel 2. More specifically, the control circuit 3 supplies a predetermined reset potential Vorst, a predetermined initial potential Vini, a predetermined reference potential Vref and the like to the display panel 2.

Furthermore, the control circuit 3 generates an analog image signal Vid on the basis of the image data Video. More specifically, a look-up table in which a potential that shows the image signal Vid, and a brightness of the light-emitting element (an OLED 130 to be described later) that the display panel 2 is provided with are associated and stored, is provided in the control circuit 3. Further, the control circuit 3 generates an image signal Vid that shows a potential that corresponds to the brightness of the light-emitting element that is defined by image data Video by referring to the look-up table, and supplies the image signal Vid to the display panel 2.

As shown in FIG. 2, the display panel 2 is provided with a display section 100, and drive circuits (a data line drive circuit 10 and a scanning line drive circuit 20) that drives the display section 100.

Pixel circuits 110 that correspond to the pixels of an image to be displayed are arranged in matrix form in the display section 100. In more detail, in the display section 100, m rows of scanning lines 12 are provided to extend in the horizontal direction (the X direction) in the drawing, and in addition, (3n) columns of data lines 14 that are grouped every three columns are provided to extend in the vertical direction (the Y direction) in the drawing and to have mutual electrical insulation from each scanning line 12. Further, pixel circuits 110 are provided to correspond to the intersecting sections of m rows of scanning lines 12 and (3n) columns of data lines 14. Therefore, in the embodiment, the pixel circuits 110 are arranged in matrix from with m vertical rows×(3n) horizontal columns.

In this case, m and n are both positive integers. In order to discriminate the rows among the matrix of the scanning lines 12 and the pixel circuits 110, there are cases in which the foregoing are called rows 1, 2, 3, . . . , (m−1) and m in order from the top of the drawing. In the same manner, in order to discriminate the columns of the matrix of the data lines 14 and the pixel circuits 110, there are cases in which the foregoing are called columns 1, 2, 3, . . . , (3n−1), and (3n) in order from the left of the drawing. In addition, in order to normalize and describe the groups of data lines 14, if a j integers that are one or more and n or less are used, counting from the left, the data lines 14 of a $(3j-2)^{th}$ column, a $(3j-1)^{th}$ column and a $(3j)^{th}$ column belong to a $j^{th}$ group.

Additionally, three pixel circuits 110 that correspond to the intersections of scanning lines 12 of the same row and three columns of data lines 14 that belong to the same group respectively correspond to pixels of R (red), G (green) and B (blue), and these three pixels represent 1 dot of a color image that is to be displayed. That is, a configuration that represents the color of a dot using the light emission of an OLED that corresponds to R, G and B with additive color mixing is used in the embodiment.

In addition, as shown in FIG. 2, (3n) columns of feed lines 16 are provided in the display section 100 to extend in the vertical direction and to have mutual electrical insulation from each scanning line 12. The predetermined reset potential Vorst is mutually fed to each feed line 16. In this case, in order to discriminate the columns of the feed lines 16, there are cases in which the foregoing are called the 1, 2, 3, . . . , (3n), and $(3n+1)^{th}$ column of the feed lines 16 in order from the left of the drawing. Each feed lines 16 from a $1^{st}$ column to a $(3n)^{th}$ column is provided to correspond to each data line 14 of a $1^{st}$ column to a $(3n)^{th}$ column.

In addition, (3n) storage capacities 50 are provided in the display panel 2 to correspond to each data line 14 of the $1^{st}$ column to the $(3n)^{th}$ column. The storage capacities 50 have two electrodes. A first electrode of each storage capacity 50 is connected to a data line 14 and a second electrode is connected to a feed line 16. That is, the storage capacities 50 function as second storage capacities that store the potential of each data line 14. Additionally, it is preferable that the storage capacities 50 be formed by sandwiching an insulating body (a dielectric body) between mutually adjacent feed lines 16 and data lines 14. In such a case, the distance between the mutually adjacent feed lines 16 and data lines 14 is established so as to obtain a capacity of a necessary size. Additionally, hereinafter, the capacitance value of the storage capacities 50 is given as Cdt.

In FIG. 2, the storage capacities 50 are provided on the outside of the display section 100, but this is an equivalent circuit, and the storage capacities 50 may be provided on the inside of the display section 100. In addition, the storage capacities 50 may be provided to span from the inside of the display section 100 to the outside.

In accordance with the control signal Ctr, the scanning line drive circuit 20 generates scanning signals Gwr for scanning each row of the scanning lines 12 in order during a period of a frame. In this case, the scanning signals Gwr that are supplied to the 1, 2, 3, . . . , and $m^{th}$ scanning lines 12 are respectively given as Gwr(1), Gwr(2), Gwr(3), . . . , Gwr(m−1), and Gwr(m).

Additionally, in addition to the scanning signals Gwr(1) to Gwr(m) the scanning line drive circuit 20 generates various control signals for each row in synchronization with the scanning signals Gwr and supplies the foregoing to the display section 100, but this is not shown in FIG. 2. In addition, the period of a frame may be a period necessary for the electro-optical device 1 to display one cut (coma) of image, for example, if the frequency of the vertical synchronizing signal that is included in the synchronizing signal is 120 Hz, the period of a frame is 8.3 milliseconds, the period of one cycle thereof.

The data line drive circuit 10 is provided with (3n) level shift circuits LS that are provided to have a one-to-one correspondence with each (3n) columns of data lines 14, n demultiplexers DM that are provided for each three columns of data lines 14 that configure each group and a data signal supply circuit 70.

The data signal supply circuit 70 generates data signals Vd(1), Vd(2), . . . , and Vd(n) on the basis of the image signal Vid and the control signal Ctr that are supplied from the control circuit 3. That is, the data signal supply circuit 70 generates data signals Vd(1), Vd(2), . . . , and Vd(n) on the basis of an image signal Vid which time-division multiplexes the data signals Vd(1), Vd(2), . . . , and Vd(n). Further, the data signal supply circuit 70 respectively supplies the data signals Vd(1), Vd(2), . . . , and Vd(n) to demultiplexers DM that correspond to the 1, 2, . . . and $n^{th}$ groups. In addition, the maximum possible value of the potential of the data signals Vd(1) to Vd (n) is set as Vmax and the minimum possible value as Vmin.

Figure 3:
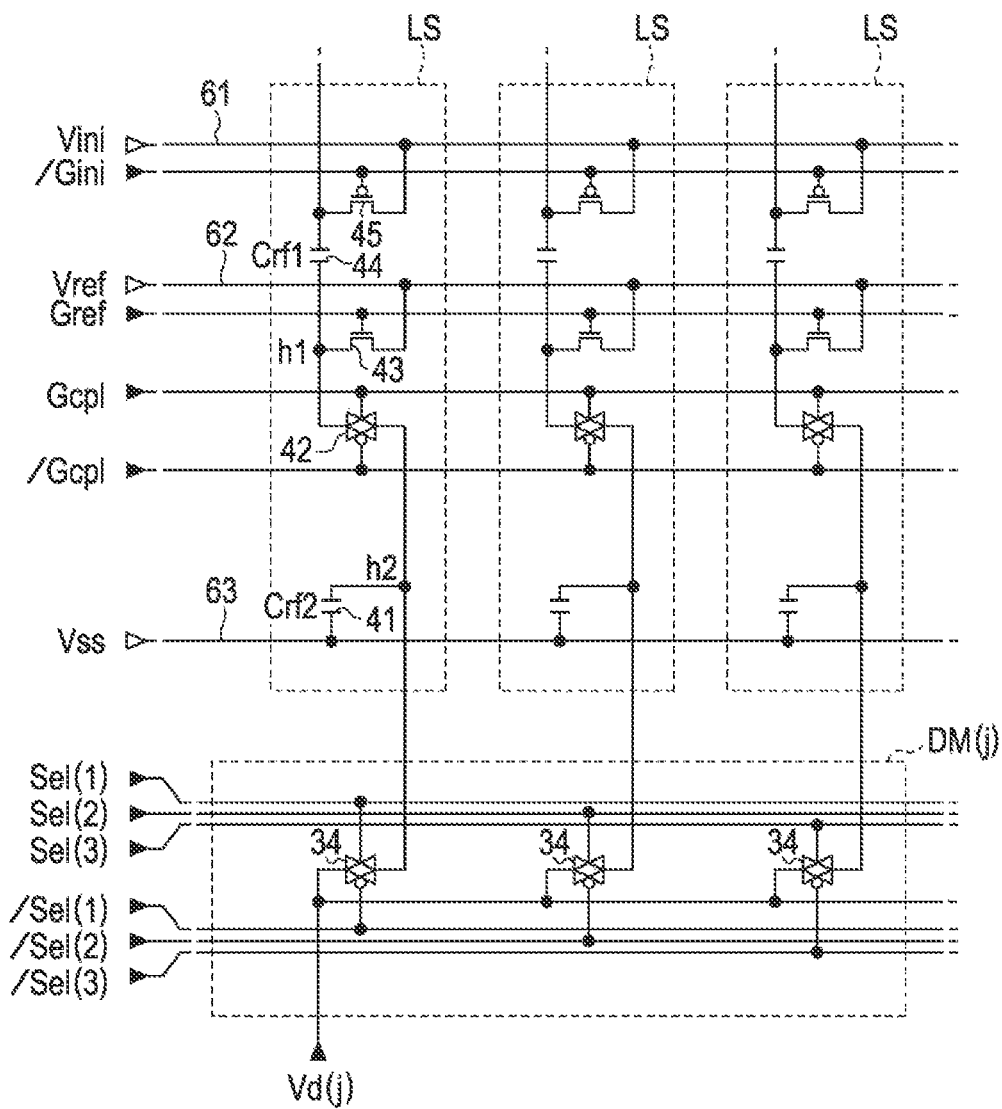
FIG. 3 is a view that shows a data line drive circuit in the same electro-optical device.

FIG. 3 is a circuit diagram for describing the configuration of a demultiplexer DM and a level shift circuit LS. FIG. 3 shows a demultiplexer DM that belongs to a $j^{th}$ group and three level shift circuits LS that are connected to the demultiplexer DM as representative examples. Additionally, hereinafter, there are cases in which the demultiplexer DM that belongs to the $j^{th}$ group is given as DM(j).

Hereinafter, the configuration of a demultiplexer DM and a level shift circuit LS will be described with reference to FIG. 3 as well as FIG. 2.

As shown in FIG. 3, the demultiplexer DM is an assembly of transmission gates 34 that are provided for each column, and supplies a data signal in order to the three columns that configure each group. In this case, input ends of the transmission gates 34 that correspond to the columns (3j−2), (3j−1) and (3j) that belong to the $j^{th}$ group are mutually interconnected, and a data signal Vd(j) is supplied to a common terminal thereof. The transmission gate 34 that is provided in the (3j−2) column, which is the left end column in the $j^{th}$ group, is on (conductive) when the control signal Sel(1) is at an H level (when the control signal /Sel(1) is at an L level). In the same manner, the transmission gate 34 that is provided in the (3j−1) column, which is the central column in the $j^{th}$ group, is on when the control signal Sel(2) is at an H level (when the control signal /Sel(2) is at an L level), and the transmission gate 34 that is provided in the (3j) column, which is the right end column in the $j^{th}$ group, is on when the control signal Sel(3) is at an H level (when the control signal /Sel(3) is at an L level).

The level shift circuit LS has a set of a storage capacity 41, a storage capacity 44, a P channel MOS-type transistor 45 (first transistor), an N channel MOS-type transistor 43 (second transistor), and a transmission gate 42 for each column, and shifts the potential of the data signal that is output from the output end of the transmission gate 34 of each column.

In this case, the storage capacity 44 has two electrodes. A first electrode of the storage capacity 44 is electrically connected to a corresponding column of a data line 14 and either one of the source and the drain of the transistor 45. In addition, a second electrode of the storage capacity 44 is electrically connected the output end of the transmission gate 42 and either one of the source and the drain of the transistor 43 through a node h1. That is, the storage capacity 44 functions as third storage capacity, the first electrode of which is electrically connected to the data line 14. Additionally, the capacitance value of the storage capacity 44 is set as Crf1.

The other of one of the source and the drain of the transistor 45 of each column is electrically connected to a feed line 61 (first potential line). In addition, the control circuit 3 commonly supplies control signals /Gini to the gate of the transistor 45 of each column. Therefore, the transistor 45 is electrically connected to the first electrode of the storage capacity 44 (and the data line 14) and the feed line 61 when the control signal /Gini is at an L level and is not electrically connected when the control signal /Gini is at an H level. Additionally, the predetermined initial potential Vini is supplied to the feed line 61 from the control circuit 3.

The other of one of the source and the drain of the transistor 43 of each column is electrically connected to a feed line 62 (second potential line). In addition, the control circuit 3 commonly supplies control signals Gref to the gate of the transistor 43 of each column. Therefore, the transistor 43 is electrically connected to the second electrode of the storage capacity 44, the node h1 and the feed line 62 when the control signal Gref is at an H level and is not electrically connected when the control signal Gref is at an L level. Additionally, the reference potential Vref is supplied to the feed line 62 from the control circuit 3.

The storage capacity 41 has two electrodes. A first electrode of the storage capacity 41 is electrically connected to an input end of the transmission gate 42 through a node h2. In addition, the output end of the transmission gate 42 is electrically connected to a second electrode of the storage capacity 44 through the node h1.

The control circuit 3 commonly supplies control signals Gcpl and control signals /Gcpl to the transmission gate 42 of each column. Therefore, the transmission gate 42 of each column is simultaneously on when the control signal Gcpl is at an H level (when the control signal /Gcpl is at an L level).

The first electrode of the storage capacity 41 of each column is electrically connected to output end of the transmission gate 34 and the input end of the transmission gate 42 through the node h2. Further, when the transmission gate 34 is on, the data signal Vd(j) is supplied to the first electrode of the storage capacity 41 through the output end of the transmission gate 34. That is, the storage capacity 41 functions as a fourth storage capacity, the first electrode of which is supplied with the data signal Vd(j). In addition, the second electrode of the storage capacity 41 of each column is commonly connected to a feed line 63 to which a potential Vss, which is a fixed potential, is supplied. In this case, the potential Vss may be a logic signal that corresponds to an L level of a scanning signal or a control signal. Additionally, the capacitance value of the storage capacity 41 is set as Crf2.

The pixel circuits 110 will be described with reference to FIG. 4. Since each pixel circuit 110 has the same configuration from an electrical point of view, in this case, the pixel circuits 110 will be described using a pixel circuit 110 of row i, column (3j−2), which is positioned in the $i^{th}$ row, and the $(3j−2)^{th}$ column of the left end column among the $j^{th}$ group, as an example. Additionally, i is a symbol that commonly shows the rows in which pixel circuits 110 are arranged, and is an integer that is 1 or more and m or less.

Figure 4:
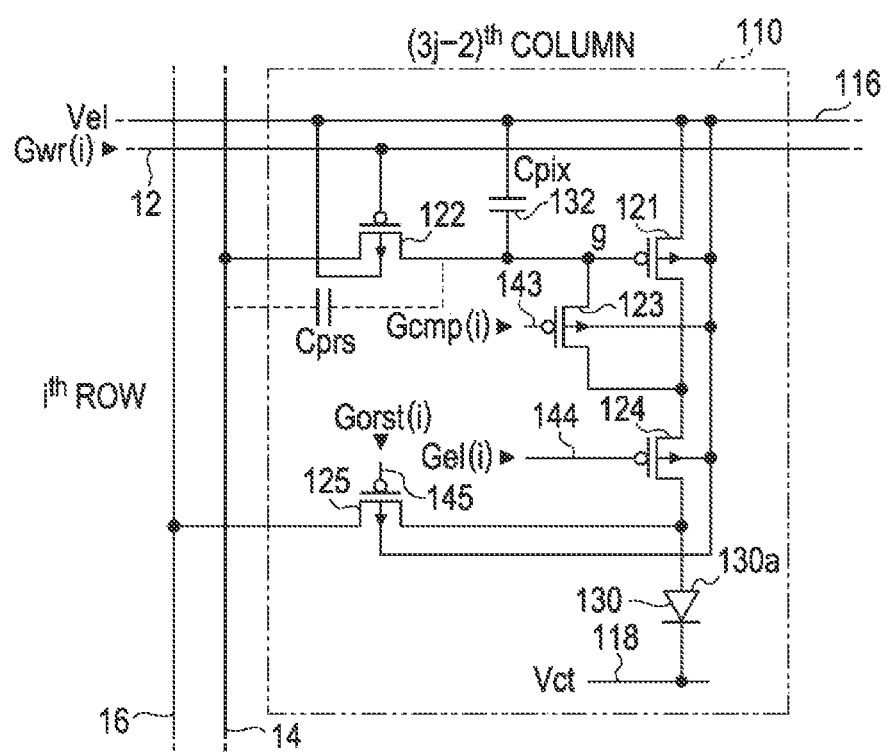
FIG. 4 is a view that shows a pixel circuit in the same electro-optical device.

As shown in FIG. 4, the pixel circuit 110 includes P channel MOS-type transistors 121 to 125, an OLED 130 and a storage capacity 132. The scanning signal Gwr(i), and control signals Gcmp(i), Gel(i) and Gorst(i) are supplied to the pixel circuit 110. In this case, the scanning signal Gwr(i), and the control signals Gcmp(i), Gel(i) and Gorst(i) are respectively supplied by a scanning line drive circuit 20 that corresponds to the $i^{th}$ row.

Additionally, although not shown in FIG. 2, m rows of control lines 143 (first control lines) that extend in the horizontal direction (the X direction) in FIG. 2, m rows of control lines 144 (second control lines) that extend in the horizontal direction and m rows of control lines 145 (third control lines) that extend in the horizontal direction are provided in the display panel 2 (display section 100). Further, the scanning line drive circuit 20 respectively supplies control signals Gcmp(1), Gcmp(2), Gcmp(3), . . . and Gcmp(m) to the 1, 2, 3, . . . and $m^{th}$ rows of control lines 143, respectively supplies control signals Gel(1), Gel(2), Gel(3), . . . and Gel(m) to the 1, 2, 3, . . . and $m^{th}$ rows of control lines 144, and respectively supplies control signals Gorst(1), Gorst(2), Gorst(3), . . . and Gorst(m) to the 1, 2, 3, . . . and $m^{th}$ rows of control lines 145. That is, the scanning line drive circuit 20 commonly supplies the scanning signal Gwr(i), and the control signals Gel(i), Gcmp(i)

and Gorst(i) to (3n) pixel circuits 110 positioned in the i$^{th}$ row through the scanning line 12 and the control lines 143, 144 and 145 of the i$^{th}$ row respectively. Hereinafter, there are cases in which the scanning line 12, the control line 143, the control line 144 and the control line 145 are referred to as "the control line". That is, four control lines that include the scanning line 12 are provided in each row in the display panel 2 according to the embodiment.

The gate of the transistor 122 is electrically connected to the scanning line 12 of the i$^{th}$ row, and either one of the source and the drain thereof is electrically connected to the data line 14 of the (3j−2)$^{th}$ column. In addition, the storage capacity 132 has two electrodes. The other one of the source and the drain of the transistor 122 is respectively electrically connected to the gate of the transistor 121, the first electrode of the storage capacity 132, and either one of the source and the drain of the transistor 123. That is, the transistor 122 is electrically connected between the transistor 121 and the data line 14 and functions as a write-in transistor that controls the electrical connection between the gate of the transistor 121 and the data line 14. Additionally, hereinafter, there are cases in which the wiring that electrically connects the gate of the transistor 121, the other one of the source and the drain of the transistor 122, one of the source and the drain of the transistor 123 and the first electrode of storage capacity 132 is referred to as a gate node g (of the transistor 121).

The source of the transistor 121 is electrically connected to a feed line 116, and the drain thereof is electrically connected to the other one of the source and the drain of the transistor 123 and the source of the transistor 124. In this case, a potential Vel, which is on the high side of a power supply in the pixel circuit 110, is supplied to the feed line 116. This transistor 121 functions as a drive transistor that flows a current that depends on the voltage between the gate and the source of the transistor 121.

The gate of the transistor 123 is electrically connected to the control line 143, and the control signal Gcmp(i) is supplied thereto. This transistor 123 functions as a first switching transistor that controls the electrical connection between the gate and the drain of the transistor 121.

The gate of the transistor 124 is electrically connected to the control line 144, and the control signal Gel(i) is supplied thereto. In addition, the drain of the transistor 124 is respectively electrically connected to the source of the transistor 125 and an anode 130a of the OLED 130. This transistor 124 functions as a second switching transistor that controls the electrical connection between the drain of the transistor 121 and the anode of the OLED 130.

The gate of the transistor 125 is electrically connected to the control line 145, and the control signal Gorst(i) is supplied thereto. In addition, the drain of the transistor 125 is electrically connected to the feed line 16 of the (3j−2)$^{th}$ column and keeps the reset potential Vorst. This transistor 125 functions as a third switching transistor that controls the electrical connection between the feed line 16 and the anode 130a of the OLED 130.

Since the display panel 2 in the embodiment is formed on a silicon substrate, the substrate potentials of the transistors 121 to 125 are set as the potential Vel.

Additionally, the abovementioned sources and drains of the transistors 121 to 125 may be exchanged depending on the channel type and the relationship of the potentials of the transistors 121 to 125. In addition, the transistors may be thin film transistors or electric field effect transistors.

The first electrode of the storage capacity 132 is electrically connected to the gate of the transistor 121 and the second electrode thereof is electrically connected to the feed line 116. Therefore, the storage capacity 132 functions as a first storage capacity that stores the voltage between the gate and the source of the transistor 121. Additionally, the capacitance value of the storage capacity 132 is given as Cpix. At this time, the capacitance value Cdt of the storage capacity 50, the capacitance value Crf1 of the storage capacity 44 and the capacitance value Cpix of the storage capacity 132 are set so as to satisfy $$Cdt > Crf1 >> Cpix.$$

That is, the capacitance values are set so that Cdt is greater than Crf1, and Cpix is sufficiently smaller than Cdt and Crf1. Additionally, as the storage capacity 132, a capacity that leeches to the gate node g of the transistor 121 may be used or a capacity that is formed by sandwiching an insulating layer between mutually different conductive layers on a silicon substrate, may be used.

The anode 130a of the OLED 130 is a pixel electrode that is individually provided for each pixel circuit 110. In contrast to this, a cathode of the OLED 130 is a common electrode 118 that is commonly provided to span all of the pixel circuits 110, and keeps a potential Vct, which is on the low side of a power supply in the pixel circuit 110. The OLED 130 is an element in which a white organic EL layer is sandwiched between the anode 130a and a light transmissive cathode on the abovementioned silicon base. Further, color filters that correspond to one of RGB are overlapped on the outgoing side (cathode side) of the OLED 130.

In this type of OLED 130, when a current flows from the anode 130a to the cathode, holes injected from the anode 130a and electrons injected from the cathode recombine in the organic EL layer, generate excitons and white light is created. The white light created at this time is configured to pass through the cathode on the opposite side from the silicon substrate (anode 130a) and be visible on an observer's side after undergoing coloration by the color filters.

Next, the configuration of a pixel circuit 110 will be described with reference to FIGS. 5 and 6.

Figure 5:
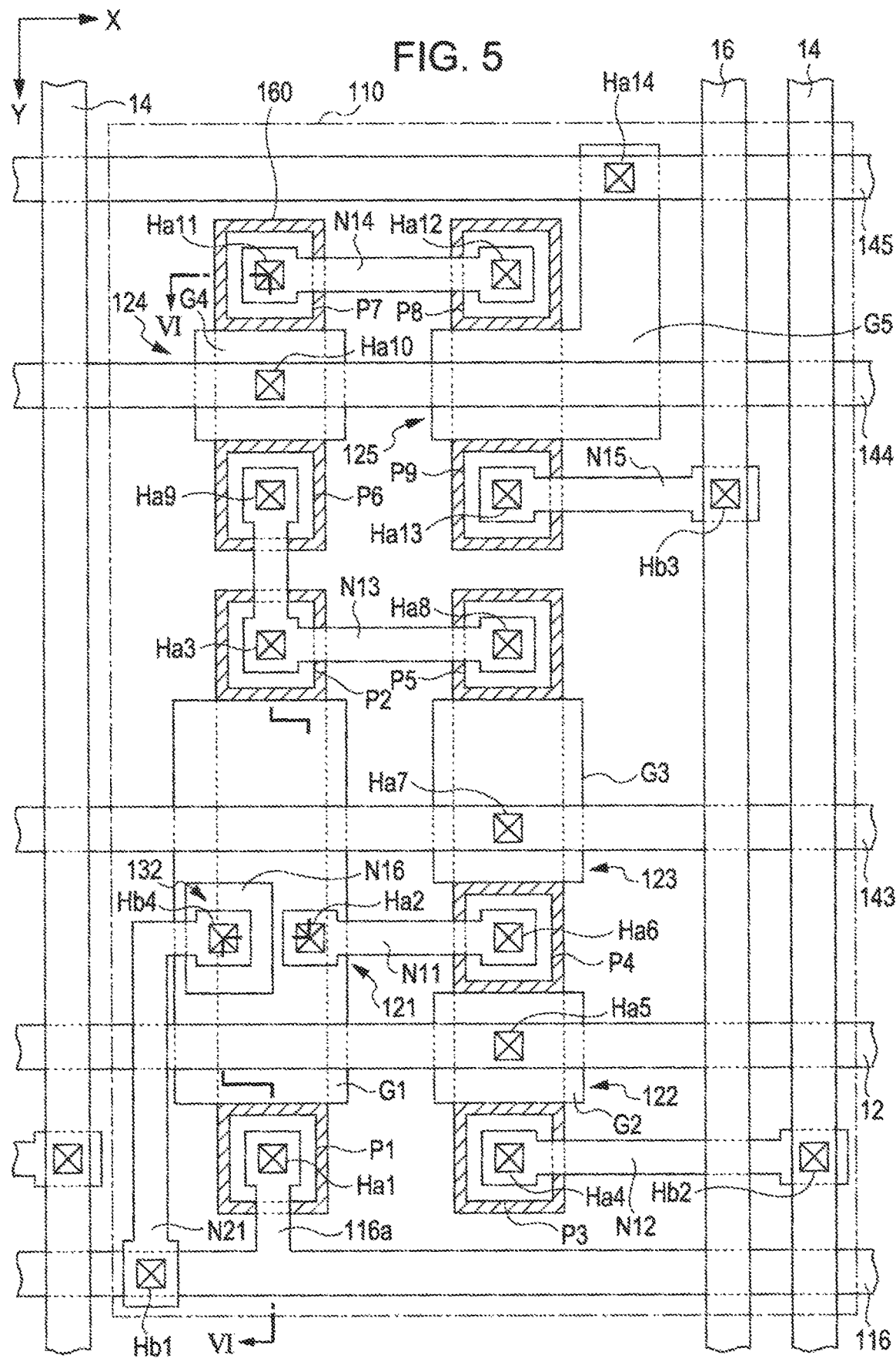
FIG. 5 is a plan view that shows the configuration of the pixel circuit in the same electro-optical device.

FIG. 5 is a plan view that shows the configuration of the pixel circuit 110 of row i, column (3j−2). This FIG. 5 shows the wiring structure in a case in which a pixel circuit 110 with a top emission structure is viewed in plan view from the observation side thereof, but in order to simplify the view, the structures formed in areas other than the anode 130a of the OLED 130 have been omitted. In addition, FIG. 6 is a partial cross-sectional view that has been cut at line VI-VI in FIG. 5. In FIG. 6, the area up to the anode 130a of the OLED 130 is shown and other structures have been omitted. Additionally, in FIGS. 5 and 6, there are cases in which each layer, each member, each region and the like are shown at different scales in order to show the foregoing at recognizable sizes.

Figure 6:
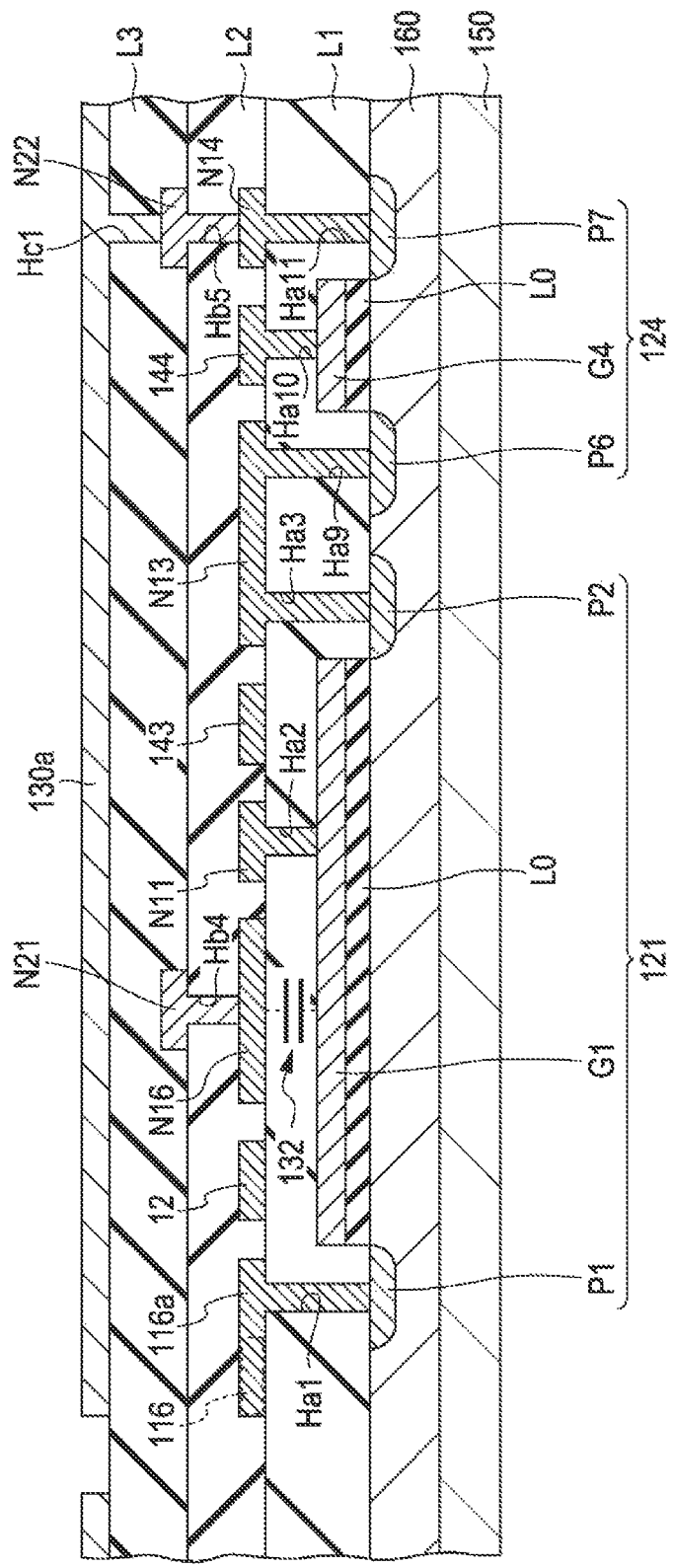
FIG. 6 is a partial cross-sectional view that shows the configuration of the pixel circuit in the same electro-optical device.

As shown in FIG. 6, each component that configures the pixel circuit 110 is formed on a silicon substrate 150. In the embodiment, a P-type semiconductor substrate is used as the silicon substrate 150. An N well 160 is formed across almost the entire surface of the silicon substrate 150. Additionally, in FIG. 5, in order to easily understand the regions in which the transistors 121 to 125 are provided when viewed in plan view, among the N well 160, only the regions in which the transistors 121 to 125 are provided and the vicinities thereof are shown with hatching.

The potential Vel is supplied to the N well 160 through an N-type diffusion layer (not shown). Therefore, the substrate potentials of the transistors 121 to 125 are the potential Vel.

As shown in FIGS. 5 and 6, a plurality of P-type diffusion layers are formed on the surface of the N well 160 as a result of doping with ions. More specifically, 9 P-type diffusion layers P1 to P9 are formed on the surface of the N well 160 for each pixel circuit 110. These P-type diffusion layers P1 to P9 function as the sources and the drains of the transistors 121 to 125. In addition, gate insulation layers L0 are formed on the surfaces of the N well 160 and the P-type diffusion layers P1 to P9, and gate electrodes G1 to G5 are formed on the surfaces of the gate insulation layers L0 using patterning. These gate electrodes G1 to G5 function as the gates of the transistors 121 to 125.

As shown in FIG. 5, the transistor 121 has the gate electrode G1, the P-type diffusion layer P1 and the P-type diffusion layer P2. Among these, the P-type diffusion layer P1 functions as the source of the transistor 121 and the P-type diffusion layer P2 functions as the drain of the transistor 121.

In addition, the transistor 122 has the gate electrode G2, the P-type diffusion layer P3 and the P-type diffusion layer P4. Among these, the P-type diffusion layer P3 functions as either one of the source and the drain of the transistor 122 and the P-type diffusion layer P4 functions as the other one of the source and the drain of the transistor 122.

The transistor 123 has the gate electrode G3, the P-type diffusion layer P4 and the P-type diffusion layer P5. Among these, the P-type diffusion layer P4 functions as either one of the source and the drain of the transistor 123 and the P-type diffusion layer P5 functions as the other one of the source and the drain of the transistor 123. That is, the P-type diffusion layer P4 functions as either one of the source and the drain of the transistor 123 in addition to functioning as the other one of the source and the drain of the transistor 122.

The transistor 124 has the gate electrode G4, the P-type diffusion layer P6 and the P-type diffusion layer P7. Among these, the P-type diffusion layer P6 functions as the source of the transistor 124 and the P-type diffusion layer P7 functions as the drain of the transistor 124.

Additionally, in the embodiment, the drain of the transistor 121, the other one of the source and the drain of the transistor 123 and the source of the transistor 124 are respectively configured by the individual P-type diffusion layers P2, P5 and P6, but may be configured by a single P-type diffusion layer. In such a case, it is not necessary to provide a relay node N13 that will be described later.

The transistor 125 has the gate electrode G5, the P-type diffusion layer P8 and the P-type diffusion layer P9. Among these, the P-type diffusion layer P8 functions as the source of the transistor 125 and the P-type diffusion layer P9 functions as the drain of the transistor 125.

As shown in FIG. 6, a first interlayer insulation layer L1 is formed to cover the gate electrodes G1 to G5 and the gate insulation layers L0.

In addition to a scanning line 12, a feed line 116 and control lines 143 to 145 being respectively formed on the surface of the first interlayer insulation layer L1 for each row through patterning of a conductive wiring layer made of aluminum or the like, relay nodes N11 to N16 and a branched section 116a are respectively formed thereon for each pixel circuit 110. Additionally, there are cases in which these wiring layers that are formed on the surface of the first interlayer insulation layer L1 are referred to as a first wiring layer.

As shown in FIG. 5, the feed line 116 has a section (the branched section 116a) that is branched in the Y direction for each pixel circuit 110 in addition to extending in X direction that intersects the Y direction. The branched section 116a is provided so that a portion of the branched section 116a and the P-type diffusion layer P1 mutually overlap each other when viewed in plan view (that is, when the pixel circuit 110 is viewed from a direction that is perpendicular to a surface of the silicon substrate 150 on which the pixel circuit 110 is formed). In addition, as shown in FIGS. 5 and 6, the branched section 116a electrically connected to the P-type diffusion layer P1 through a contact hole Ha1 that penetrates the first interlayer insulation layer L1. Additionally, in FIG. 5, the contact hole is shown with portions in which heterogeneous wiring layers overlap as portions with an "×" symbol on a "☐" symbol.

As shown in FIG. 5, the scanning line 12 is provided to intersect the gate electrode G1 and the gate electrode G2 when viewed in plan view in addition to extending in the X direction. That is, when viewed in plan view, at least a portion of the scanning line 12 and at least a portion of the gate electrode G1 overlap. In addition, the scanning line 12 is electrically connected to the gate electrode G2 through a contact hole Ha5.

The control line 143 is provided to intersect the gate electrode G1 and the gate electrode G3 when viewed in plan view in addition to extending in the X direction. In addition, the control line 143 is electrically connected to the gate electrode G3 through a contact hole Ha1.

The control line 144 is provided to intersect the gate electrode G4 when viewed in plan view in addition to extending in the X direction, and is electrically connected to the gate electrode G4 through a contact hole Ha10. The control line 145 is provided to intersect the gate electrode G5 when viewed in plan view in addition to extending in the X direction, and is electrically connected to the gate electrode G5 through a contact hole Ha14.

As shown in FIGS. 5 and 6, the relay node N11 is electrically connected to the P-type diffusion layer P4 through a contact hole Ha6 in addition to being electrically connected to the gate electrode G1 through a contact hole Ha2. That is the relay node N11 corresponds to a gate node g that is electrically connected to the gate of the transistor 121, the other one of the source and the drain of the transistor 122 and either one of the source and the drain of the transistor 123.

The relay node N16 is provided so that the relay node N16 and a portion of the gate electrode G1 mutually overlap when viewed in plan view. Further, the storage capacity 132 is formed by first interlayer insulation layer L1 being sandwiched by the relay node N16 and the gate electrode G1. That is, the gate electrode G1 corresponds to the first electrode of the storage capacity 132, and the relay node N16 corresponds to the second electrode of the storage capacity 132.

The relay node N12 is electrically connected to the P-type diffusion layer P3 through a contact hole Ha4. The relay node N13 is electrically connected to the P-type diffusion layer P5 through a contact hole Ha8 and electrically connected to the P-type diffusion layer P6 through a contact hole Hag in addition to being electrically connected to the P-type diffusion layer P2 through a contact hole Ha3. The relay node N14 is electrically connected to the P-type diffusion layer P8 through a contact hole Ha12 in addition to being electrically connected to the P-type diffusion layer P7 through a contact hole Ha11. The relay node N15 is electrically connected to the P-type diffusion layer P9 through a contact hole Ha13.

As shown in FIG. 6, a second interlayer insulation layer L2 is formed to cover the first wiring layer and the first interlayer insulation layer L1.

In addition to a data line 14 and a feed line 16 being respectively formed on the surface of the second interlayer insulation layer L2 for each column through patterning of a conductive wiring layer made of aluminum or the like, relay nodes N21 and N22 are respectively formed thereon for each pixel circuit 110. Additionally, there are cases in which these wiring layers that are formed on the surface of the second interlayer insulation layer L2 are referred to as a second wiring layer.

As shown in FIG. 5, the data line 14 is electrically connected to the relay node N12 through a contact hole Hb2. According to this configuration, the P-type diffusion layer P3 is electrically connected to the data line 14 through the relay node N12. The feed line 16 is electrically connected to the relay node N15 through a contact hole Hb3. According to this configuration, the P-type diffusion layer P9 is electrically connected to the feed line 16 through the relay node N15. The relay node N21 is electrically connected to the relay node N16 (the second electrode of the storage capacity 132) through a contact hole Hb4 in addition to being electrically connected to the feed line 116 through a contact hole Hb1. According to this configuration, the relay node N16 is electrically connected to the feed line 116 through the relay node N21 and keeps the potential Vel.

In addition, as shown in FIG. 6, the relay node N22 is electrically connected to the relay node N14 through a contact hole Hb5.

As shown in FIG. 6, a third interlayer insulation layer L3 is formed to cover the second wiring layer and the second interlayer insulation layer L2. The anode 130a of the OLED 130 is formed on the surface of the third interlayer insulation layer L3 through patterning of a conductive wiring layer made of aluminum, ITO (Indium Tin Oxide) or the like. The anode 130a of the OLED 130 is an individual pixel electrode for each pixel circuit 110, and is connected to the relay node N22 through a contact hole Hc1 that penetrates the third interlayer insulation layer L3. That is, the anode 130a of the OLED 130 is electrically connected to the P-type diffusion layer P7 (that is, the drain of the transistor 124) and the P-type diffusion layer P8 (that is, the source of the transistor 125) through the relay node N22 and the relay node N14.

In addition, although not shown in the drawing, a light-emitting layer formed from an organic EL material that is divided for each pixel circuit 110 is laminated on the anode 130a of the OLED 130. Further, a cathode (common electrode 118), which is a common transparent electrode that spans all of the plurality of pixel circuits 110, is provided on the light-emitting layer. That is, the OLED 130 emits light at a brightness that depends on a current that flows from the anode toward the common electrode 118 by sandwiching the light-emitting layer with an anode and a cathode that face one another. Among the light that the OLED 130 emits, the light that is emitted toward the direction opposite the silicon substrate 150 (that is, the upward direction in FIG. 6) is visible by an observer as a picture (top emission structure). In addition to this, a sealing material or the like for shielding the light-emitting layer from the atmosphere is provided, but the description thereof has been omitted.

OPERATIONS OF THE EMBODIMENT

Figure 7:
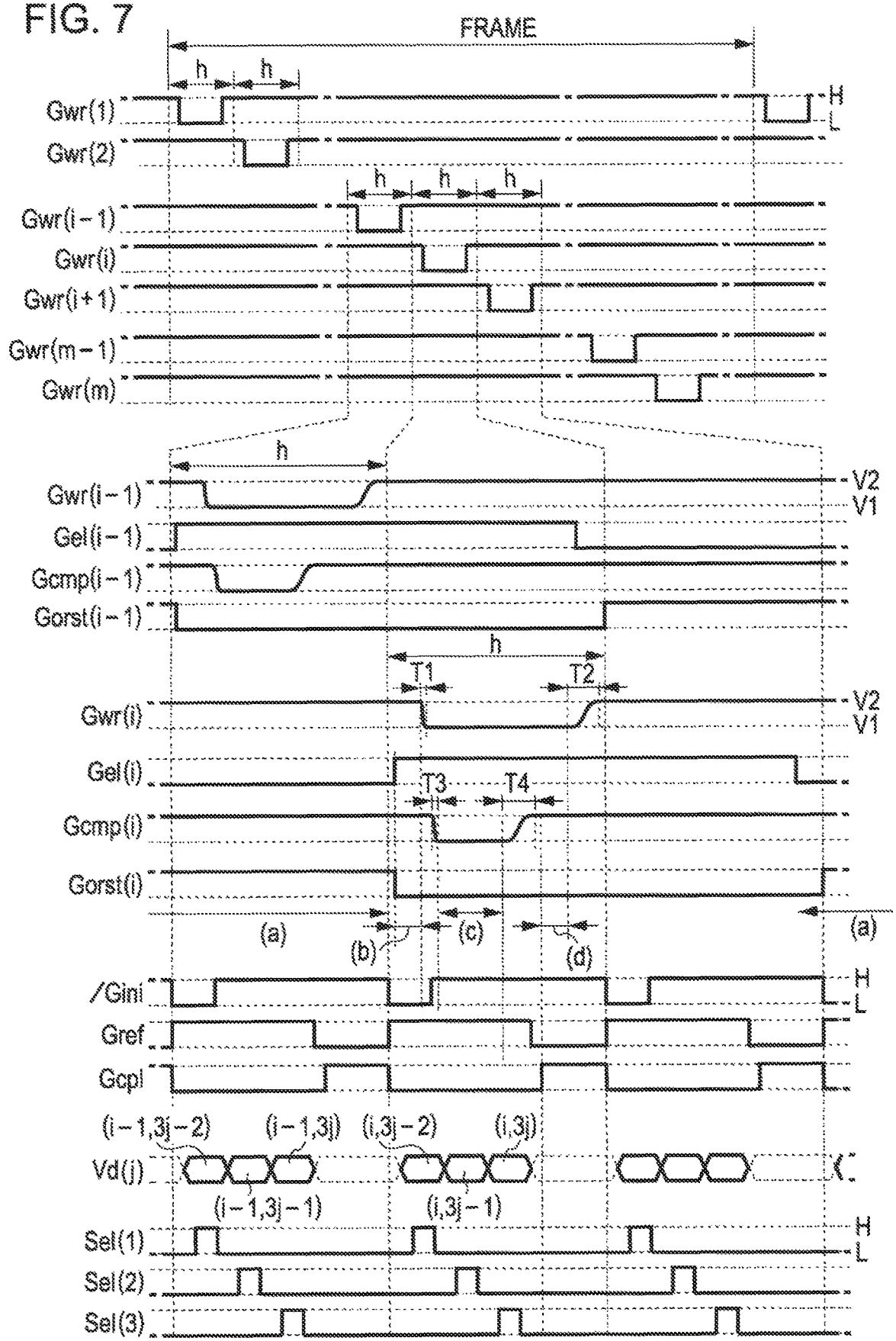
FIG. 7 is a timing chart that shows the operations of the same electro-optical device.

The operation of the electro-optical device 1 will be described with reference to FIG. 7. FIG. 7 is a timing chart for describing the operations of each section in the electro-optical device 1. As shown in this drawing, the scanning line drive circuit 20 scans the $1^{st}$ to $m^{th}$ scanning lines 12 in order in the period of 1 frame for each horizontal scanning period (h) by sequentially switching the scanning signals Gwr(1) to Gwr(m) to an L level. The operation in a single horizontal scanning period (h) common across each row of pixel circuits 110. Considering this, hereinafter, the operation will be described focusing on a scanning period in which the $i^{th}$ row, in particular, the pixel circuit 110 of row i, column (3j–2) is horizontally scanned.

In the embodiment, the scanning period of the $i^{th}$ row is separated into an initialization period that is shown as (b) in FIG. 7, a compensation period that is shown as (c), and a write-in period that is shown as (d). Further, after the write-in period of (d), there is a light emission period shown as (a) and after the period of one frame has passed, there is another scanning period of the $i^{th}$ row. Therefore, if considered in chronological order, the scanning period is a repetition of the cycle (light emission period)→initialization period→compensation period→write-in period→(light emission period).

Additionally, in FIG. 7, each of the scanning signal Gwr(i–1) and control signals Gel(i–1), Gcmp(i–1) and Gorst(i–1) that correspond to the $(i–1)^{th}$ row that is one row before the $i^{th}$ row forms a wave profile in which the foregoing respectively precede the scanning signal Gwr(i) and control signals Gel(i), Gcmp(i) and Gorst(i) that correspond to the $i^{th}$ row by a single horizontal scanning period (h) in terms of time.

Light Emission Period

For convenience of description, the light emission period will be described from the light emission period that comes before the initialization period. In the light emission period of the $i^{th}$ row, the scanning line drive circuit 20 supplies a predetermined second potential V2 to the scanning line 12 of the $i^{th}$ row, supplies a predetermined first potential V1 to the control line 144 of the $i^{th}$ row, supplies the second potential V2 to the control line 143 of the $i^{th}$ row and supplies the second potential V2 to the control line 145 of the $i^{th}$ row. Additionally, in the embodiment, the first potential V1 is set to be lower than the second potential V2. For example, the first potential V1 may be a potential that corresponds to an L level of the control signal (control signal Gref and the like) that the control circuit 3 supplies, and the second potential V2 may be a potential that corresponds to an H level of the control signal that the control circuit 3 supplies. That is, as shown in FIG. 7, in the light emission period of the $i^{th}$ row, the scanning signal Gwr(i) is set to an H level, the control signal Gel(i) is set to an L level, the control signal Gcmp(i) is set to an H level and the control signal Gorst(i) is set to an H level.

Figure 8:
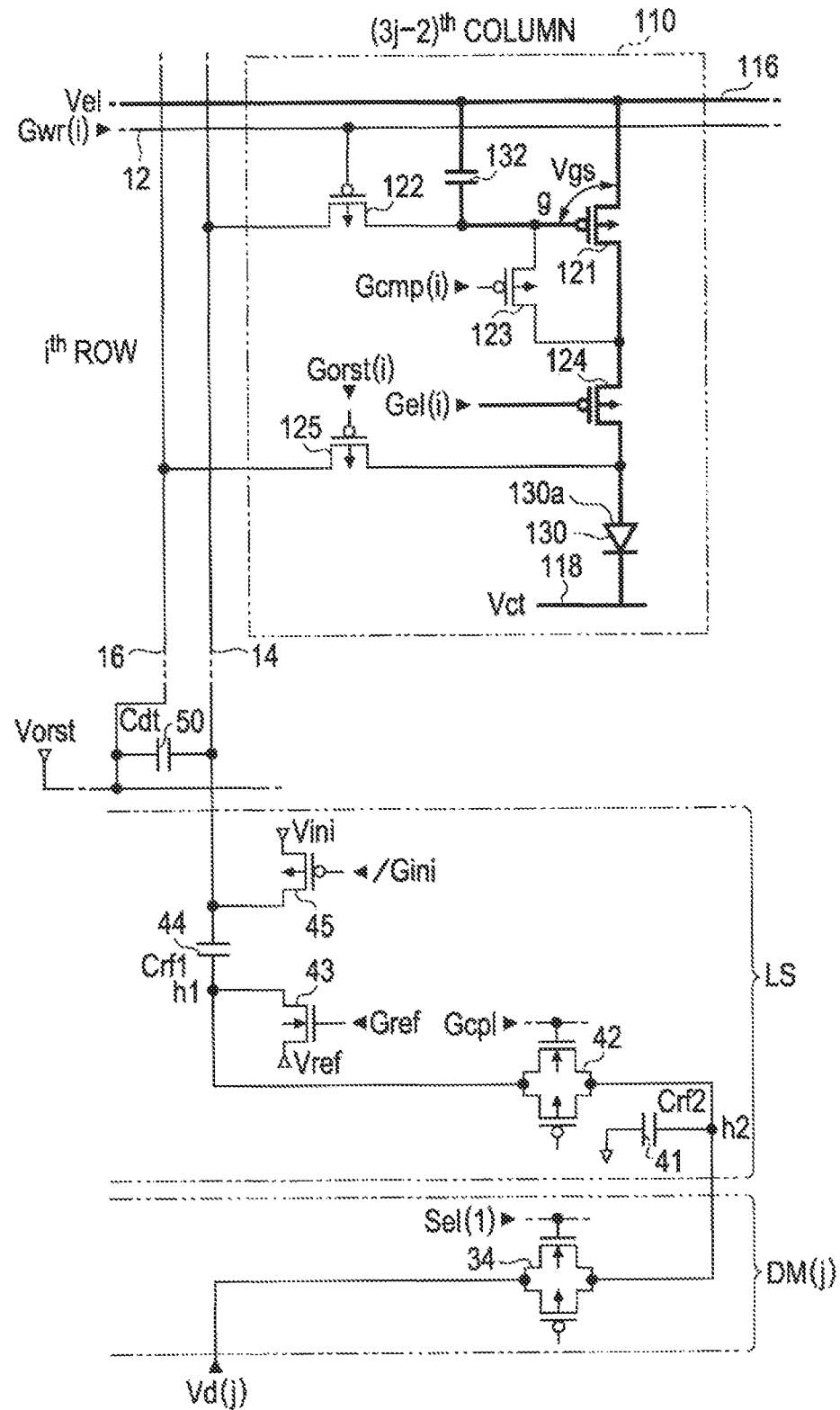
FIG. 8 is an operation explanatory view of the same electro-optical device.

Therefore, as shown in FIG. 8, in the pixel circuit 110 of row i, column (3j–2), the transistor 124 is turned on, and the transistors 122, 123 and 125 are turned off. Therefore, the transistor 121 supplies a current Ids that depends on a voltage Vgs between the gate and the source thereof to the OLED 130. As will be described later, in the embodiment, the voltage Vgs of the light emission period is a level-shifted value of the potential of the data signal. Therefore, a current that depends on gradation level is supplied to the OLED 130 in a state in which the threshold voltage of the transistor 121 has been compensated for.

Additionally, since the light emission period of the $i^{th}$ row is a period in which rows other than the $i^{th}$ row are horizontally scanned, the potential of the data line 14 fluctuates as appropriate. However, since the transistor 122 in the pixel circuit 110 of the $i^{th}$ row is turned off, fluctuations in the potential of the data line 14 are not taken into consideration in this case. In addition, in FIG. 8, a pathway that is important in the description of the operations in the light emission period is shown with a thick line.

Initialization Period

Next, at the start of the scanning period of the $i^{th}$ row, firstly, the initialization period of (b) is started as a first period. In the initialization period of the $i^{th}$ row, as shown in FIG. 7, the scanning line drive circuit 20 supplies the second potential V2 to the scanning line 12 of the $i^{th}$ row and sets the scanning signal Gwr(i) to an H level, supplies the second potential V2 to the control line 144 of the $i^{th}$ row and sets the control signal Gel(i) to an H level, supplies the second potential V2 to the control line 143 of the $i^{th}$ row and sets the control signal Gcmp(i) to an H level, and supplies the first potential V1 to the control line 145 of the $i^{th}$ row and sets the control signal Gorst(i) to an L level. Therefore, in the pixel circuit 110 of row i, column (3j−2), the transistor 124 is turned off and the transistor 125 is turned on. As a result, the anode 130a of the OLED 130 is set as a reset potential Vorst in addition to the pathway of the current that is supplied to the OLED 130 being blocked.

Since the OLED 130 has a configuration in which, as described above, an organic EL layer is sandwiched between the anode 130a and the cathode, a capacity is leeched in parallel between the anode and the cathode. When a current flows to the OLED 130 in the light emission period, the voltages of both ends between the anode and the cathode of the OLED 130 are stored by the capacity that is leeched in parallel between the anode and the cathode, but this stored voltage is reset by the transistor 125 being turned on. Therefore, in the embodiment, when another current flows to the OLED 130 in a subsequent light emission period, it is unlikely that the voltage stored by the capacity that is leeched in parallel between the anode and the cathode will have an effect.

In more detail, for example, when the display state is switched from a high brightness to a low brightness, since the high voltage from when the brightness is high (a large current flows) is stored if a configuration which does not reset is used, even if an attempt to flow a small current is made subsequently, an excess current flows, and it is no longer possible to display at a low brightness. In contrast to this, in the embodiment, since the potential of the anode 130a of the OLED 130 is reset as a result of the transistor 125 being turned on, it is possible to improve the reproducibility of the low brightness side. Additionally, in the embodiment, the reset potential Vorst is set so that the difference between the reset potential Vorst and a potential Vct of the common electrode 118 falls below the light emission threshold voltage of the OLED 130. Therefore, in the initialization period (the compensation period and the write-in period that will be explained next) the OLED 130 is in an off (non-emission) state.

Meanwhile, in the initialization period of the $i^{th}$ row, as shown in FIG. 7, the control circuit 3 respectively sets the control signal /Gini to an L level, the control signal Gref to an H level and the control signal Gcpl to an L level. Therefore, the transistor 43 and the transistor 45 are in on states. According to this configuration, the first electrode of the storage capacity 44 and the feed line 61 are electrically connected, and the first electrode of the storage capacity 44 (and the data line 14) is initialized to the initial potential Vini. In addition, the second electrode of the storage capacity 44 and the feed line 62 are electrically connected, and the second electrode of the storage capacity 44 (and the node h1) is initialized to the reference potential Vref.

The initial potential Vini in the embodiment is set so that (Vel−Vini) is greater than the threshold voltage of the transistor 121 |Vth|. Additionally, since the transistor 121 is a P-channel type, the threshold voltage Vth that uses the potential of the source as a reference is negative. Therefore, in order to prevent confusion in the explanation of the high and low relationship, the threshold voltage is expressed using an absolute value of |Vth|, and defined using a large and small relationship.

As shown in FIG. 7, the data signal supply circuit 70 respectively supplies the data signals Vd(1), Vd(2), . . . , Vd(n) to each demultiplexer DM(1), DM(2), . . . , DM(n) in a period from after the start of the scanning period of the $i^{th}$ row to the start of the write-in period. That is, in terms of the $j^{th}$ group, the data signal supply circuit 70 switches the data signal Vd(j) to a potential that depends on the gradation level of the pixels of row i, column (3j−2), row i, column (3j−1) and row i, column (3j) in order.

Meanwhile, control circuit 3 exclusively sets the control signals Sel(1), Sel(2) and Sel(3) to an H level in order in conformity with the switch in potential of the data signal. According to this configuration, the three transmission gates 34 provided in each demultiplexer DM are respectively turned on in order from the left end column, the central column and the right end column.

In this case, in a case in which the transmission gate 34 of the left end column that belongs to the $j^{th}$ group is turned on by the control signal Sel(1) in the initialization period, since the data signal Vd(j) is supplied to the first electrode of the storage capacity 41, the data signal Vd(j) is stored by the storage capacity 41.

Compensation Period

Next, in the scanning period of the $i^{th}$ row, the compensation period of (c) is performed as the second period. In the compensation period of the $i^{th}$ row, as shown in FIG. 7, the control circuit 3 respectively sets the control signal /Gini to an H level, the control signal Gref to an H level and the control signal Gcpl to an L level. Therefore, while the transistor 43 is turned into an on state, the transistor 45 is turned into an off state. According to this configuration, the second electrode of the storage capacity 44 and the feed line 62 are electrically connected, and the node h1 is set as the reference potential Vref.

In addition, in the compensation period, in a case in which the transmission gate 34 of the left end column that belongs to the $j^{th}$ group is turned on by the control signal Sel(1) in the compensation period, the data signal Vd(j) is supplied to the first electrode of the storage capacity 41.

Additionally, in a case in which the transmission gate 34 of the left end column that belongs to the $j^{th}$ group has already been turned on by the control signal Sel(1) in the initialization period, the transmission gate 34 does not turn on, but the data signal Vd(j) that was supplied when the transmission gate 34 of the left end column was turned on is stored by the storage capacity 41.

In addition, in the compensation period of the $i^{th}$ row, as shown in FIG. 7, the scanning line drive circuit 20 supplies the first potential V1 to the scanning line 12 of the $i^{th}$ row and sets the scanning signal Gwr(i) to an L level, supplies the second potential V2 to the control line 144 of the $i^{th}$ row and sets the control signal Gel(i) to an H level, supplies the first potential V1 to the control line 143 of the $i^{th}$ row and sets the control signal Gcmp(i) to an L level, and supplies the first potential V1 to the control line 145 of the $i^{th}$ row and sets the control signal Gorst(i) to an L level. Therefore, since the transistor 123 is turned on, the transistor 121 becomes a diode connection. According to this configuration, a drain current flows to the transistor 121, and the gate node g and data line 14 are charged. In more detail, the current flows along a pathway from the feed line 116→the transistor 121→the transistor 123→the transistor 122→the data line 14 of the (3j−2)$^{th}$ column. Therefore, the data line 14 and the gate node g that are in a mutually connected state as a result of the transistor 121 being turned on rise from the initial potential Vini. However, since the current that flows along the abovementioned pathway flows less easily as the gate node g approaches the potential (Vel−|Vth|), the data line 14 and the gate node g are saturated with the potential (Vel−|Vth|) until the end of the compensation period is reached.

Therefore, the storage capacity 132 stores the threshold voltage |Vth| of the transistor 121 at the end of the compensation period. Additionally, hereinafter, there are cases in which the potential (Vel−|Vth|) is given as potential Vp.

When the compensation period finishes, the scanning line drive circuit 20 updates the control signal Gcmp(i) from an L level to an H level by switching the potential that is supplied to the control signal 143 from the first potential V1 to the second potential V2. According to this configuration, the diode connection of the transistor 121 is removed.

Additionally, the scanning line drive circuit 20 switches the potential that is supplied to the control line 143 so as to make the waveform when the control signal Gcmp(i) is changed from an L level to an H level gradual in comparison with the change from an H level to an L level. That is, as shown in FIG. 7, the scanning line drive circuit 20 sets the period in which the potential that is supplied to the control line 143 is switched from the second potential V2 to the first potential V1 as a third switching period T3, and sets the period in which the potential is switched from the first potential V1 to the second potential V2 as a fourth switching period T4. At this time, the scanning line drive circuit 20 changes the potential that is supplied to the control line 143 so that the duration of the fourth switching period T4 is sufficiently long in comparison with the duration of the third switching period T3.

As described above, the control line 143 and the gate electrode G1 (the gate of the transistor 121) intersect when viewed in plan view. Therefore, there is a parasitic capacity between the control line 143 and the gate electrode G1. Accordingly, in a hypothetical case in which the duration of the fourth switching period T4 is shortened to be the same as the third switching period T3, and the control signal Gcmp(i) is rapidly raised from an L level to an H level, the effect of the high-frequency component of the control signal Gcmp(i) in the control line 143 is received, and the potential of the gate electrode G1 is changed.

This will be described in more detail later, but the potential of the gate node g (the potential of the gate electrode G1) at the end of the compensation period is established as a potential in which the variation in the threshold voltage of the transistor 121 for each pixel circuit 110 has been compensated for. However, in a case in which the potential of the gate node g is changed after the end of the compensation period, since it is no longer possible to compensate for the variation in the threshold voltage for each pixel circuit 110, a problem in which display unevenness such as the impairment of display screen uniformity become more pronounced.

In contrast to this, in the embodiment, the duration of the fourth switching period T4 is made to be sufficiently longer than the duration of the third switching period T3, and propagation of the fluctuation in potential of the control line 143 to the gate node g (gate electrode G1) is prevented by making the waveform when the control signal Gcmp(i) changes from an L level to an H level a gradual waveform. According to this configuration, the variation in the threshold voltage of each pixel circuit 110 can be compensated for, and a high integrity display in which evenness in the display is secured is possible.

Additionally, the duration of the third switching period T3 is effectively sufficiently short so that it is possible to consider the foregoing as "0". That is, the waveform when the control signal Gcmp(i) is lowered from an H level to an L level, may be, for example, a waveform that is equivalent to the waveform when the control signal Gref is lowered from an H level to an L level. However, in FIG. 7, for convenience of description, in order to show the third switching period T3, the waveform of the rise in the control signal Gcmp(i) is recorded as a gradual waveform in comparison with the effective waveform thereof.

In addition, once the compensation period has finished, since the control circuit 3 updates the control signal Gref from an H level to an L level, the transistor 43 is turned off. Therefore, although the pathway to the gate node g in the pixel circuits 110 from the (3j−2)$^{th}$ row of the data line 14 to row i, column (3j−2) becomes a floating state, the potential of the pathway is preserved at (Vel−|Vth|) by the storage capacities 50 and 132.

Write-In Period

After the initialization period, the write-in period of (d) is performed as the third period. As shown in FIG. 7, in the write-in period of the i$^{th}$ row, the scanning line drive circuit 20 supplies the first potential V1 to the scanning line 12 of the i$^{th}$ row and sets the scanning signal Gwr(i) to an L level, supplies the second potential V2 to the control line 144 of the i$^{th}$ row and sets the control signal Gel(i) to an H level, supplies the second potential V2 to the control line 143 of the i$^{th}$ row and sets the control signal Gcmp(i) to an H level, and supplies the first potential V1 to the control line 145 of the i$^{th}$ row and sets the control signal Gorst(i) to an L level. According to this configuration, the diode connection of the transistor 121 is removed.

In addition, as shown in FIG. 7, in the write-in period of the i$^{th}$ row, the control circuit 3 respectively sets the control signal /Gini to an H level, the control signal Gref to an L level and the control signal Gcpl to an H level. Therefore, since the transistor 42 is turned on, the data signal Vd(j) that was stored in the storage capacity 41 is supplied to the second electrode of the storage capacity 44 through the node h1. According to this configuration, the node h1 and the second electrode of the storage capacity 44 are changed from the reference potential Vref in the compensation period. The amount of the change in potential of the node h1 at this time is expressed as ΔVh. In addition, there are cases in which the potential of the node h1 in the write-in period (Vref+ΔVh) is expressed as a potential Vh.

Additionally, in a case in which the potential of the node h1 is changed from the reference potential Vref to the potential Vh by ΔVh only, the potentials of the gate node g and the data line 14 also change from the potential Vp= (Vel−|Vth|) set in the compensation period. The amount of the change in potential of the gate node g at this time is expressed as ΔVg. In addition, there are cases in which the potential of the gate node g in the write-in period (Vp+ΔVg) is expressed as a potential Vgate.

Hereinafter, the changes in the potentials of the gate node g and the node h1 before and after the start of the write-in period will be described while referring to FIGS. 9A and 9B.

FIG. 9A is an explanatory view for describing the changes in the potentials of the node h1 and the gate node g before and after the start of the write-in period. In the drawing, (A-1) represents the potentials of the node h1 and the gate node g before the start of the write-in period, and (A-2) represents the potentials of the node h1 and the gate node g after the start of the write-in period (that is, after the transmission gate 42 has been turned on). Additionally, in the compensation period and the write-in period, since the storage capacity 50 and the storage capacity 132 are electrically connected in parallel, the capacitance value C0 of a combined capacity 501 of the storage capacity 50 and the storage capacity 132 is expressed by the following equation (1).

$$C0 = Cpix + Cdt \quad (1)$$

If the charge that is accumulated in the combined capacity 501 before the start of the write-in period is set as Q0a and the charge that is accumulated in the combined capacity 501 after the start of the write-in period is set as Q0b, the charge that flows out from the combined capacity 501 before and after the start of the write-in period (Q0a-Q0b) is expressed by the following equation (2). In the same manner, if the charge that is accumulated in the storage capacity 44 before the start of the write-in period is set as Q1a and the charge that is accumulated in the storage capacity 44 after the start of the write-in period is set as Q1b, the charge that flows into the storage capacity 44 before and after the start of the write-in period (Q1b-Q1a) is expressed by the following equation (3). Since the charge that flows out of the combined capacity 501 before and after the start of the write-in period and the charge that flows into the storage capacity 44 before and after the start of the write-in period are equal, the following equation (4) is established.

$$Q0a - Q0b = C0*(Vp - Vgate) \quad (2)$$

$$Q1b - Q1a = Crf1*\{(Vgate - Vh) - (Vp - Vref)\} \quad (3)$$

$$Q0a - Q0b = Q1b - Q1a \quad (4)$$

It is possible to calculate the potential Vgate of the gate node g in the write-in period using equation (2) to equation (4). More specifically, the potential Vgate is expressed by the following equation (5).

$$Vgate = \{Crf1/(Crf1 + C0)\}*\{Vh - Vref\} + Vp \quad (5)$$

In this case, a capacity ratio k1 shown in the following equation (6) is introduced. At this time, using the capacity ratio k1, it is possible to express the potential Vgate of the gate node g in the write-in period with the following equation (7), and using the capacity ratio k1, it is possible to express the amount of the change in potential ΔVg of the gate node g before and after the write-in period with the following equation (8).

$$k1 = Crf1/(Crf1 + Cdt + Cpix) \quad (6)$$

$$Vgate = k1*(Vh - Vre) - Vp = k1*\Delta Vh + Vp \quad (7)$$

$$\Delta Vg = Vgate - Vp = k1*\Delta Vh \quad (8)$$

In this manner the potential of the gate node g in the write-in period changes from a potential Vp=(Vel−|Vth|) in the compensation period to a potential Vgate=(Vel−|Vth|+k1*ΔVh) which is shifted in the upward direction by the product of the amount of the change in potential of the node h1 ΔVh and the capacity ratio k1 (k1*ΔVh). At this time, as shown in the following equation (9), the absolute value |Vgs| of the voltage Vgs of the transistor 121 becomes a value from which the rise in potential of the gate node g from the threshold voltage |Vth| thereof has been subtracted.

$$|Vgs| = |Vth| - k1*\Delta Vh \quad (9)$$

FIG. 9B is an explanatory view for describing the changes in the potentials of the node h1 and the gate node h2 before and after the start of the write-in period. In the drawing, (B-1) represents the potentials of the node h1 and the node h2 before the start of the write-in period, and (B-2) represents the potentials of the node h1 and the node h2 after the start of the write-in period (that is, after the transmission gate 42 has been turned on). Additionally, in the compensation period and the write-in period, since the combined capacity 501 of the storage capacity 50 and the storage capacity 132 and the storage capacity 41 are electrically connected in series, the capacitance value C1 of a combined capacity 502 of the storage capacity 50, the storage capacity 132 and the storage capacity 44 is expressed by the following equation (10).

$$C1 = (C0*Crf1)/(C0 + Crf1) \quad (10)$$

If the charge that is accumulated in the combined capacity 502 before the start of the write-in period is set as Q1c and the charge that is accumulated in the combined capacity 502 after the start of the write-in period is set as Q1d, the charge that flows out from the combined capacity 502 before and after the start of the write-in period (Q1c-Q1d) is expressed by the following equation (11). In the same manner, if the charge that is accumulated in the storage capacity 41 before the start of the write-in period is set as Q2c and the charge that is accumulated in the storage capacity 41 after the start of the write-in period is set as Q2d, the charge that flows into the storage capacity 41 before and after the start of the write-in period (Q2d−Q2c) is expressed by the following equation (12). Since the charge that flows out of the combined capacity 502 before and after the start of the write-in period and the charge that flows into the storage capacity 41 before and after the start of the write-in period are equal, the following equation (13) is established.

$$Q1c - Q1d = C1*\{Vref - Vh\} \quad (11)$$

$$Q2d - Q2c = Crf2*\{Vh - Vd(j)\} \quad (12)$$

$$Q1c - Q1d = Q2d - Q2c \quad (13)$$

Therefore, it is possible to calculate the potential Vh of the node h1 in the write-in period using equation (11) to equation (13). More specifically, the potential Vh is expressed by the following equation (14). In addition, the amount of the change in potential in the node h1 ΔVh is expressed by the following equation (15).

$$Vh = \{C1/(C1 + Crf2)\}*(Vref) + \{Crf2/(C1 + Crf2)\}*\{Vd(j)\} \quad (14)$$

$$\Delta Vh = Vh - Vref = \{Crf2/(C1 + Crf2)\}*\{Vd(j) - Vref\} \quad (15)$$

In this case, if a capacity ratio k2 shown in the following equation (16) is introduced, the amount of the change in potential ΔVh can also be expressed by the following equation (17).

$$k2 = Crf2/(C1 + Crf2) \quad (16)$$

$$\Delta Vh = k2*\{Vd(j) - Vref\} \quad (17)$$

By substituting the equation (17) into the equation (7), it is possible to express the potential Vgate of the gate node g in the write-in period using the following equation (18).

Accordingly, it is possible to express the amount of the change in potential ΔVg of the gate electrode G before and after the start of the write-in period using the following equation (19).

$$Vgate = k1*k2*\{Vd(j) - Vref\} + Vp \quad (18)$$

$$\Delta Vg = k1*k2*\{Vd(j) - Vref\} \quad (19)$$

In this manner, the potential of the node h1 is shifted from a potential that shows the data signal Vd(j) by the reference potential Vref, and the resulting potential is changed by a value ΔVh that is compressed by the capacity ratio k2. According to this configuration, the potential Vgate of the gate node g is changed by a value in which the amount of change in the potential of the node h1 ΔVh has been further compressed by the capacity ratio k1. That is, as shown in equation (18), in the write-in period, the potential Vgate of the gate node g is shifted from the data signal Vd(j) by the reference potential Vref, and a potential that is compressed by the multiplying the shifted potential by the capacity ratio k3=k2*k1, which is established on the basis of the capacitance values Cdt, Crf1, Crf2 and Cpix, is supplied.

Figure 10:
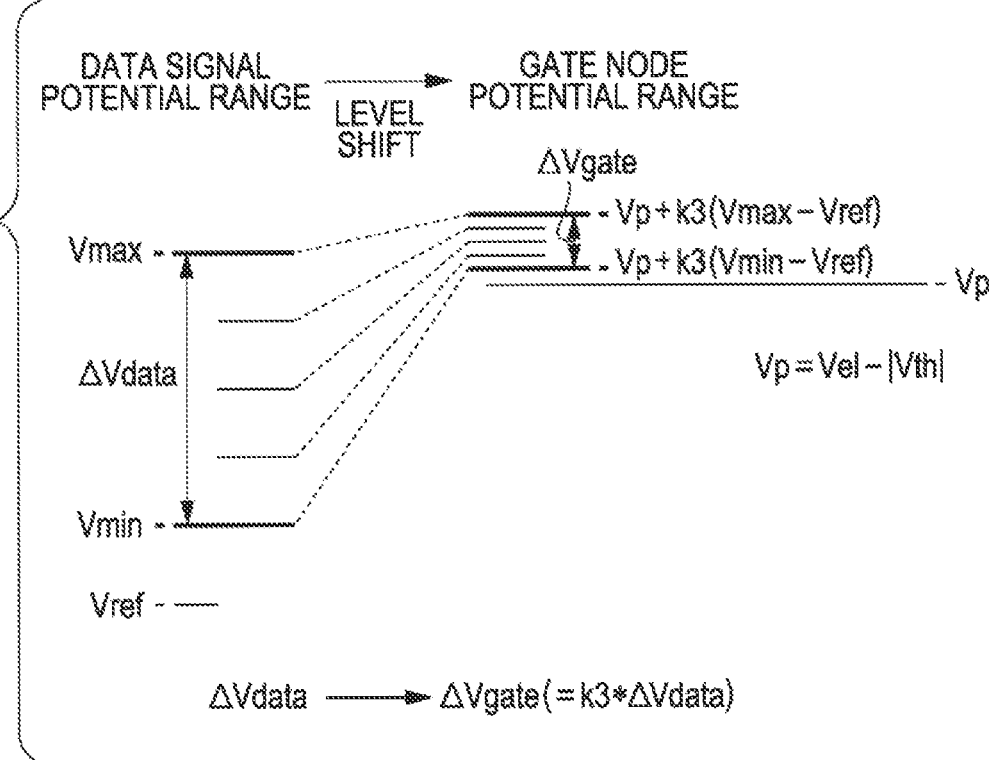
FIG. 10 is an explanatory view that shows amplitude compression of a data signal in the same electro-optical device.

FIG. 10 is a view that shows the relationship between the potential of the data signal Vd(j) and the potential Vgate of the gate node g in the write-in period. As described above, the range of the potential of the data signal Vd(j) that is created on the basis of the image signal Vid supplied from the control circuit 3 can be from a minimum value Vmin to a maximum value Vmax that depend on the gradation level of the pixels. Further, as described above, the data signal Vd(j) is shifted by the reference potential Vref, and the potential Vgate that has been compressed by the capacity ratio k3 is written into the gate node g. At this time, as shown in the following equation (20), the range of the potential ΔVgate of the gate node g is compressed by the product of the range of the potential ΔVdata (=Vmax−Vmin) of the data signal and the capacity ratio k3.

$$\Delta Vgate = k3*\Delta Vdata \quad (20)$$

In addition, as is clear from equation (18), it is possible to establish the direction and extent of the shift of the range of the potential ΔVgate of the gate node g in contrast with the range of the potential ΔVdata of the data signal on the basis of the potential Vp (=Vel−|Vth|) and the reference potential Vref.

After the write-in period has finished, the scanning line drive circuit 20 updates the scanning signal Gwr(i) from an L level to an H level by switching the potential that is supplied to the scanning line 12 from the first potential V1 to the second potential V2. According to this configuration, since the transistor 122 is turned off, the potential of the gate node g is preserved as potential Vgate=[{Vel−|Vth|}+k3·{Vd(j)−Vref}].

Additionally, the scanning line drive circuit 20 switches the potential that is supplied to the scanning line 12 so as to make the waveform when the scanning signal Gwr(i) is changed from an L level to an H level gradual in comparison with the change from an H level to an L level. That is, as shown in FIG. 7, the scanning line drive circuit 20 sets the period in which the potential that is supplied to the scanning line 12 is switched from the second potential V2 to the first potential V1 as a first switching period T1, and sets the period in which the potential is switched from the first potential V1 to the second potential V2 as a second switching period T2. At this time, the scanning line drive circuit 20 changes the potential that is supplied to the scanning line 12 so that the duration of the second switching period T2 is sufficiently long in comparison with the duration of the first switching period T1.

As described above, the scanning line 12 and the gate electrode G1 (the gate of the transistor 121) intersect when viewed in plan view. Therefore, there is a parasitic capacity between the scanning line 12 and the gate electrode G1. Accordingly, in a hypothetical case in which the duration of the second switching period T2 is shortened to be the same as the first switching period T1, and the scanning signal Gwr(i) is rapidly raised from an L level to an H level, the effect of the high-frequency component of the scanning signal Gwr(i) in the scanning line 12 is received, and the potential of the gate electrode G1 is changed.

In the abovementioned manner, at the end of the write-in period, the potential of the gate node g (the potential of the gate electrode G1) is established as the potential Vgate on the basis of the data signal Vd(j) (the image signal Vid) that defines the brightness of the OLED 130. However, in a case in which the potential of the gate node g is changed after the end of the write-in period, the potential of the gate node g becomes a potential that is different from the potential Vgate that is established on the basis of the data signal Vd(j). In this case, each pixel displays a gradation that is different from the gradation the defines the image signal Vid and the display quality is reduced.

In contrast to this, in the embodiment, the duration of the second switching period T2 is made to be sufficiently longer than the duration of the first switching period T1, and propagation of the fluctuation in potential of the scanning line 12 to the gate node g (gate electrode G1) is prevented by making the waveform when the scanning signal Gwr(i) changes from an L level to an H level a gradual waveform. According to this configuration, it is possible to accurately display each pixel with the gradation that defines the image signal Vid, and a high integrity display is possible.

Additionally, the duration of the first switching period T1 is effectively sufficiently short so that it is possible to consider the foregoing as "0". That is, the waveform when the scanning signal Gwr(i) is lowered from an H level to an L level, may be, for example, a waveform that is equivalent to the waveform when the control signal Gref is lowered from an H level to an L level. However, in FIG. 7, for convenience of description, in order to show the first switching period T1, the waveform of the rise in the scanning signal Gwr(i) is recorded as a gradual waveform in comparison with the effective waveform thereof.

Light Emission Period

After the write-in period of the $i^{th}$ row has finished, the light emission period is started. In the embodiment, after the write-in period of the $i^{th}$ row has finished, the light emission period is started after an interval of 1 horizontal scanning period. In the light emission period, as described above, since the scanning line drive circuit 20 sets the scanning signal Gwr(i) to an H level, the transistor 122 is turned off, and the gate node g is preserved at the potential Vgate= [{Vel−|Vth|}+k3·{Vd(j)−Vref}]. In addition, in the light emission period, since the scanning line drive circuit 20 sets the control signal Gel(i) to an L level, in the pixel circuit 110 of row i, column (3j−2), the transistor 124 is turned on. Since the voltage Vgs between the gate and the source thereof is [|Vth|−k3·{Vd(j)−Vref}], as shown in earlier FIG. 8, a current that depends on gradation level is supplied to the OLED 130 in a state in which the threshold voltage of the transistor 121 has been compensated for.

In the scanning period of the $i^{th}$ row, in terms of time, this kind of operation is also executed in parallel in the pixel circuits 110 of the i$^{th}$ row other than the pixel circuit 110 of the (3j−2)$^{th}$ row. Furthermore, this kind of operation of the i$^{th}$ row is effectively repeated for each frame in addition to being executed in rows 1, 2, 3, . . . , (m−1) and m in order in the period of one frame.

Effects of the Embodiment

According to the embodiment, the scanning line 12 and the control line 143 are provided in positions that intersects the gate of the transistor 121 (gate electrode G1) when viewed in plan view. Therefore, in comparison with a case in which the scanning line 12 and the control line 143 are provided not to intersect the gate of the transistor 121, it is possible to wire a plurality of control lines (the scanning line 12 and the control lines 143, 144 and 145) that extend in the X direction at high density, and control lines with a narrower pitch are possible. That is, according to the embodiment, by wiring control lines at high density, pixel circuits 110 with a narrower pitch are possible, and as a result of this, a smaller electro-optical device 1 (display section 100) and higher definition of display are possible.

According to the embodiment, the scanning line drive circuit 20 changes the potential that is supplied to the scanning line 12 so as to make the waveform when the scanning signal Gwr(i) is changed from an L level to an H level gradual in comparison with the change from an H level to an L level. According to this configuration, since propagation of the fluctuation in the potential of the scanning signal Gwr(i) to the gate of the transistor 121 is even prevented in a case in which the scanning line 12 and the gate of the transistor 121 intersect when viewed in plan view, it is possible to accurately display each pixel with the gradation that defines the image signal Vid.

According to the embodiment, the scanning line drive circuit 20 changes the potential that is supplied to the control line 143 so as to make the waveform when the control signal Gcmp(i) is changed from an L level to an H level gradual in comparison with the change from an H level to an L level. According to this configuration, since propagation of the fluctuation in the potential of the control signal Gcmp(i) to the gate of the transistor 121 is even prevented in a case in which the control line 143 and the gate of the transistor 121 intersect when viewed in plan view, a high integrity display in which evenness in the display is secured is possible.

According to the embodiment, since the range of the potential ΔVgate in the gate node g is narrowed in contrast with the range of the potential ΔVdata of the data signal, it is even possible to apply a voltage that reflects gradation level between the gate and the source of the transistor 121 when the data signal is not recorded with a fine degree of accuracy. Therefore, it is even possible to control the current that is supplied to the OLED 130 with a high degree of accuracy in cases in which the very small current that flows to the OLED 130 has a relatively large change in contrast with the change in the voltage Vgs between the gate and the source of the transistor 121 in the pixel circuit 110.

In addition, as shown by the broken line in FIG. 4, there are cases in which a capacity Cprs is leeched between the data line 14 and the gate node g in the pixel circuit 110. In this case, if the width of the change in the potential of the data line 14 is large, the foregoing propagates to the gate node g through the capacity Cprs, so called crosstalk, unevenness or the like occurs and the integrity of the display is reduced. The effect of the capacity Cprs appears notably when the pixel circuit 110 is miniaturized.

In contrast to this, in the embodiment, since the range of the change in the potential of the data line 14 is also narrowed in contrast with the range of the potential of the data signal ΔVdata, it is possible to suppress the effect through the capacity Cprs.

In addition, according to the embodiment, the effect of the threshold voltage in the current Ids that is supplied to the OLED 130 by the transistor 121 is cancelled out. Therefore, according to the embodiment, since variation is compensated for and a current that depends on gradation level is even supplied to the OLED 130 when there is variation in the threshold voltage of the transistor 121 of each pixel circuit 110, a high integrity display is possible as a result of being able to suppress the occurrence of unevenness such as impairment of display screen uniformity.

Figure 11:
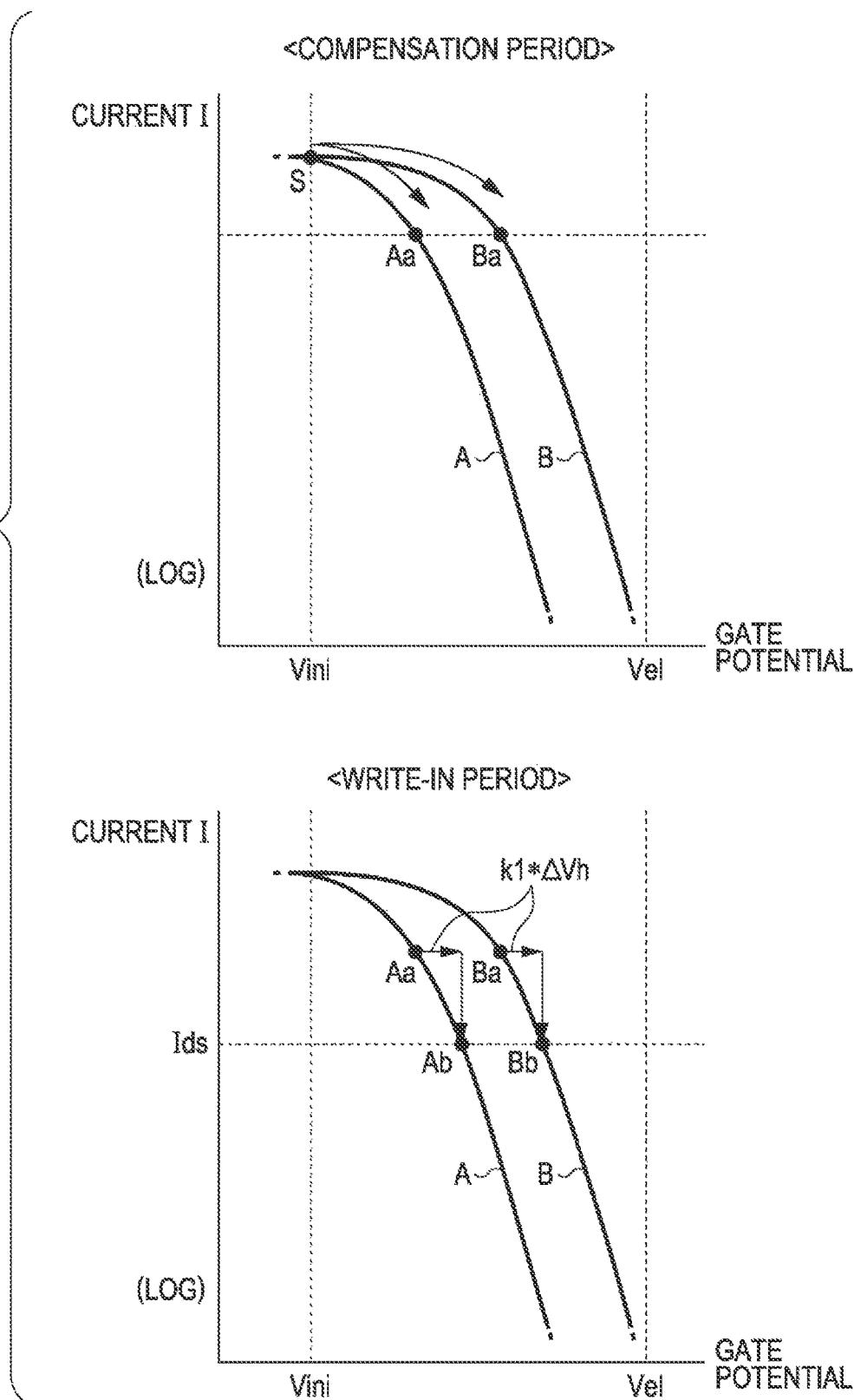
FIG. 11 is an explanatory view that shows the characteristics of a transistor in the same electro-optical device.

This cancelling out will be explained with reference to FIG. 11. As shown in the drawing, since the transistor 121 controls the very small current that is supplied to the OLED 130, the foregoing acts on a weak inversion region (a subthreshold region).

In the drawing, A shows a relationship between the gate potential in a transistor in which the threshold voltage |Vth| is large and the current that is supplied to the transistor, and B shows a relationship between the gate potential in a transistor in which the threshold voltage |Vth| is small and the current that is supplied to the transistor. Additionally, in FIG. 11, the voltage Vgs between the gate and the source is the difference between the solid line and the potential Vel. In addition, in FIG. 11, the current of the vertical axis is shown as a logarithm in which the direction from the source toward the drain in set as negative (downwards).

In the compensation period, the gate node g becomes the potential (Vel−|Vth|) from the initial potential Vini. Therefore, while the operating point of the transistor in which the threshold voltage |Vth| is large, which is expressed by solid line A, moves from S to Aa, the operating point of the transistor in which the threshold voltage |Vth| is small, which is expressed by solid line B, moves from S to Ba.

Next, in a case in which the potentials of the data signals to the pixel circuit 110 to which the two transistors belong are the same, that is, a case in which the same gradation levels are specified, in the write-in period, the amounts of the shifts in potential from the operating points Aa and Bb are k1*ΔVh that are identical. Therefore, the operating point of the transistor which is expressed by solid line A moves from Aa to Ab, and the operating point of the transistor which is expressed by solid line B moves from Ba to Bb, but the current in the operating point after the shift in potential has an almost identical Ids in both transistors.

According to the embodiment, the operation of storing the data signal that is supplied from the control circuit 3 through the demultiplexer DM in the storage capacity 41 is executed from the initialization period to the compensation period. That is, according to the embodiment, in addition to the operation of initializing the potential of the anode 130a to the reset potential Vorst and the operation of storing the data signal in the storage capacity 41 being executed in parallel in the initialization period, the operation of compensating for variation in the threshold voltage of the transistor 121 and the operation of storing the data signal in the storage capacity 41 are executed in parallel in the compensation period. Therefore, it is possible to relax the restrictions on time of the operations that are to be executed in a single horizontal scan period, and it is possible to reduce the speed of the supply operation of the data signal in the data signal supply circuit 70.

MODIFICATION EXAMPLES

The embodiment is not limited to the abovementioned embodiment, and for example, the various modifications that will be described below are possible. In addition, it is possible to arbitrarily combine one or multiple aspects of the modifications that will be described below as appropriate.

Modification Example 1

In the abovementioned embodiment, each pixel circuit 110 had a configuration in which the scanning line 12 and the control line 143 intersect the gate electrode G1 when viewed in plan view, but a configuration in which the control line 144 intersects the gate electrode G1 in addition to the scanning line 12 and the control line 143 may be used.

Figure 12:
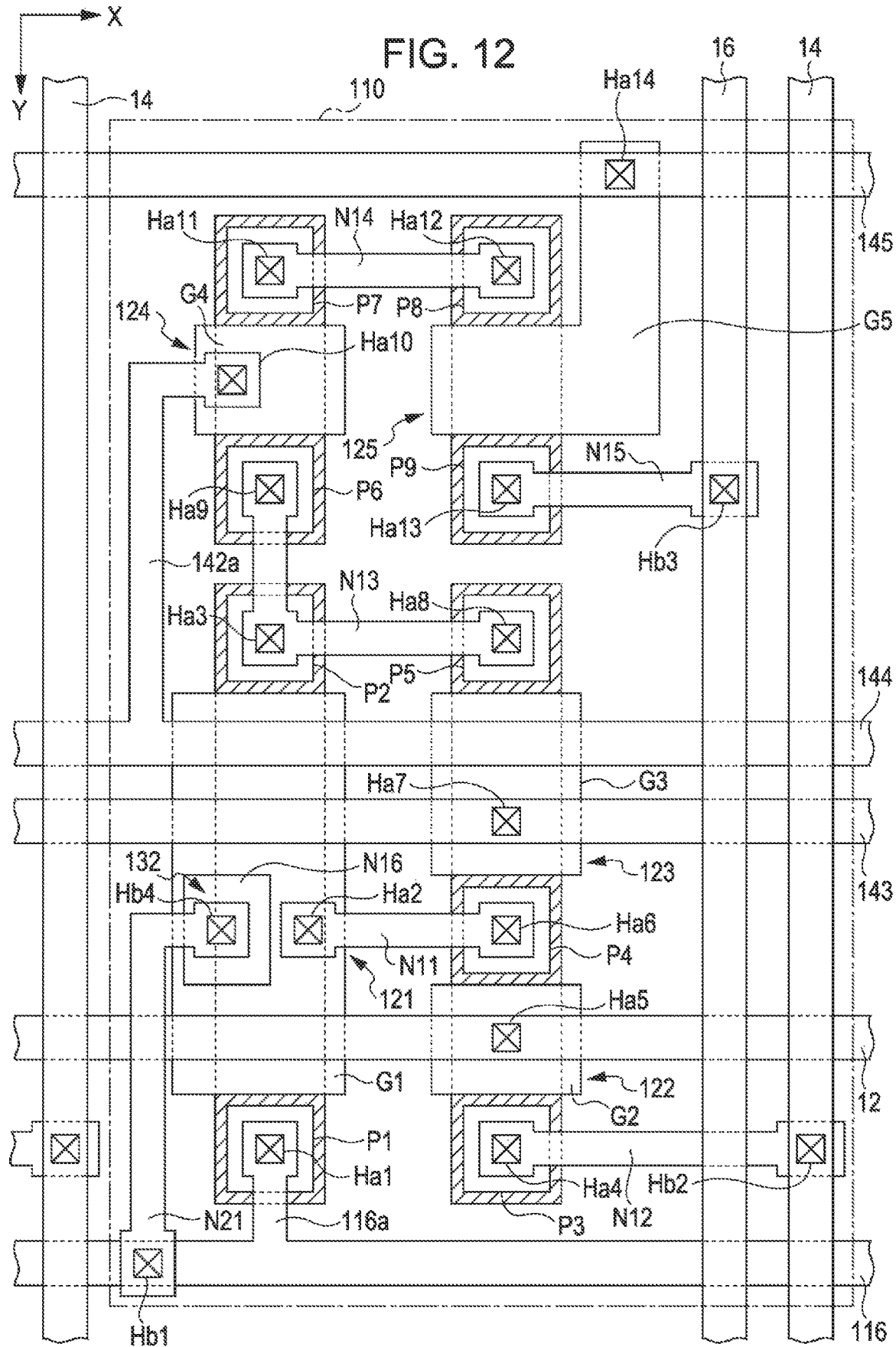
FIG. 12 is a plan view that shows the configuration of a pixel circuit in an electro-optical device according to modification example 1.

FIG. 12 is a plan view that shows the configuration of a pixel circuit 110 according to modification example 1. Apart from the feature of the control line 144 and the gate electrode G1 intersecting when viewed in plan view and a feature of the control line 144 having a branched section 142a that is branched in the Y direction for each pixel circuit 110, the pixel circuit 110 according to modification example 1 is configured in the same manner as the pixel circuit 110 according to the embodiment shown in FIG. 5.

According to this configuration, in comparison with a case in which the control line 144 is provided not to intersect the gate of the transistor 121, it is possible to wire the plurality of control lines that extend in the X direction (the scanning line 12 and the control lines 143, 144 and 145) at a high density, and control lines with a narrower pitch are possible. As a result of this, a smaller electro-optical device (display section) and higher definition of display are possible.

In addition, in a case in which the control line 144 and the gate electrode G1 intersect, the scanning line drive circuit 20 may switch the potential that is supplied to the control line 144 so as to make the waveform when the control signal Gel(i) is changed from an H level to an L level gradual in comparison with the change from an L level to an H level.

Figure 13:
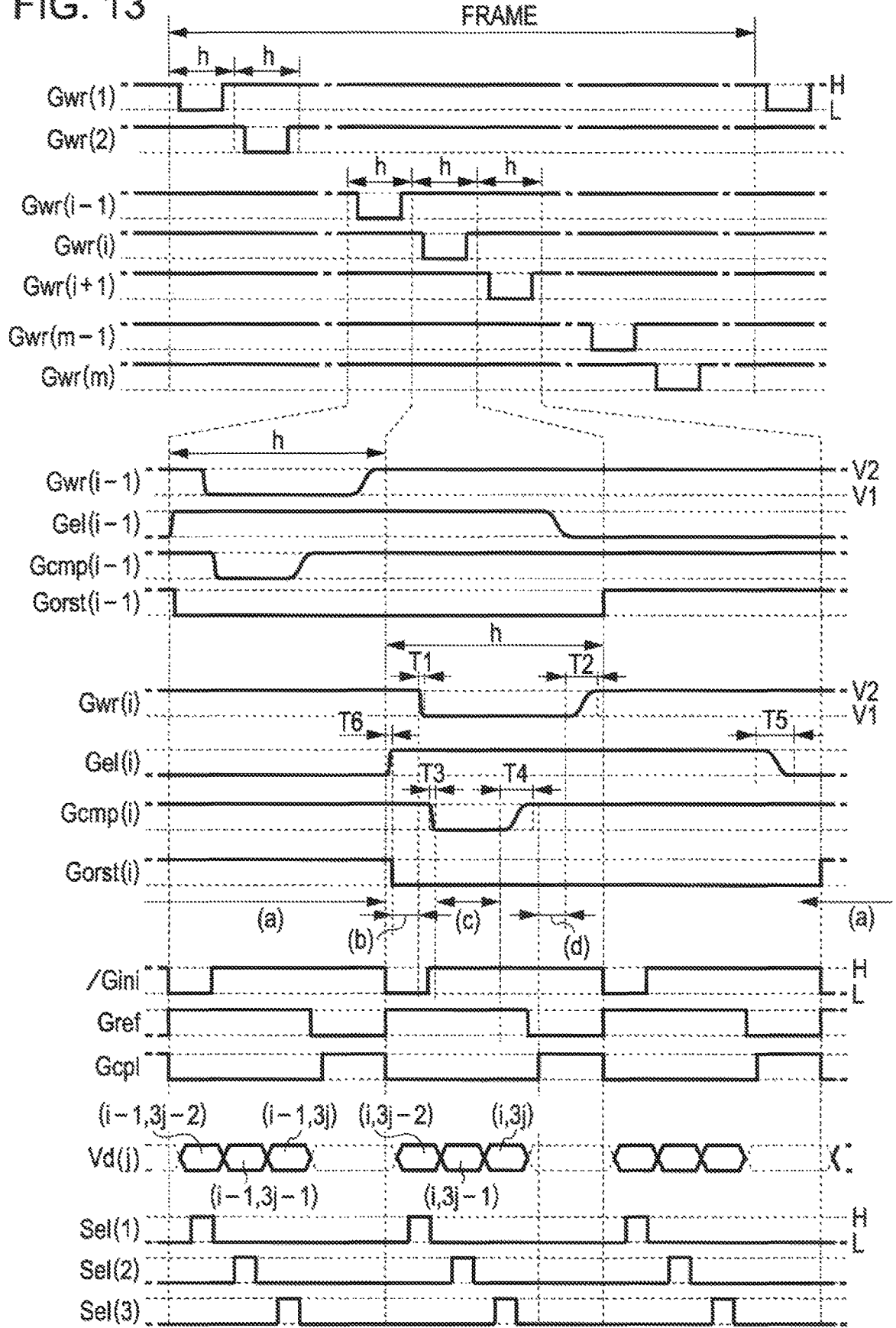
FIG. 13 is a timing chart that shows the operations of the same electro-optical device.

FIG. 13 is a timing chart for describing the operations of an electro-optical device according to modification example 1. As shown in FIG. 13, the scanning line drive circuit 20 according to modification example 1 changes the potential that is supplied to the control line 144 so that the duration of a fifth switching period T5, in which the potential that is supplied to the control line 144 is switched from the second potential V2 to the first potential V1, is sufficiently long in comparison with the duration of a sixth switching period T6, in which the potential is switched from the first potential V1 to the second potential V2.

As described above, the potential of the gate electrode G1 (the gate node g of the transistor 121) is established as the potential Vgate that defines the brightness of the OLED 130 in the write-in period that precedes the fifth switching period T5. Therefore, in a case in which the potential of the control line 144 changes rapidly in the fifth switching period T5 and the fluctuations in potential propagate to the gate electrode G1, it is not possible to accurately display each pixel with the gradation that defines the image signal Vid.

In contrast to this, the scanning line drive circuit 20 according to modification example 1 makes the duration of the fifth switching period T5 sufficiently longer than the duration of the sixth switching period T6, and prevents propagation of the fluctuation in potential of the control line 144 to the gate node g (gate electrode G1) by making the waveform when the control signal Gel(i) changes from an H level to an L level gradual. According to this configuration, it is possible to accurately display each pixel with the gradation that defines the image signal Vid, and a high integrity display is possible.

Modification Example 2

In the abovementioned embodiment, each pixel circuit 110 had a configuration in which the scanning line 12 and the control line 143 intersect the gate electrode G1 when viewed in plan view, but a configuration in which the control line 145 intersects the gate electrode G1 in addition to the scanning line 12 and the control line 143 may be used.

Figure 14:
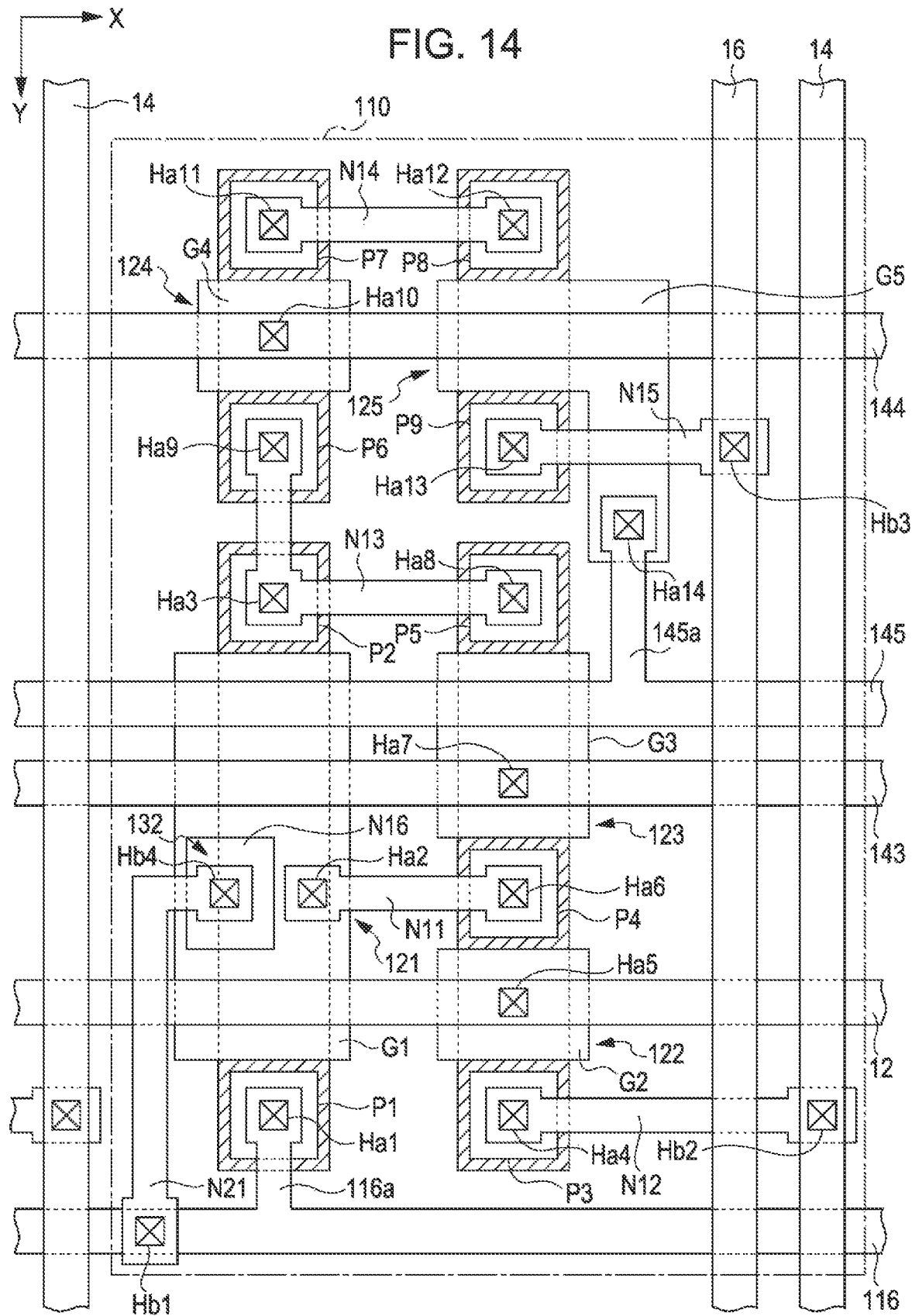
FIG. 14 is a plan view that shows the configuration of a pixel circuit in an electro-optical device according to modification example 2.

FIG. 14 is a plan view that shows the configuration of a pixel circuit 110 according to modification example 2. Apart from a feature of the control line 145 and the gate electrode G1 intersecting when viewed in plan view and a feature of the control line 145 having a branched section 145a that is branched in the Y direction for each pixel circuit 110, the pixel circuit 110 according to modification example 2 is configured in the same manner as the pixel circuit 110 according to the embodiment shown in FIG. 5.

According to this configuration, in comparison with a case in which the control line 145 is provided not to intersect the gate of the transistor 121, it is possible to wire the plurality of control lines that extend in the X direction (the scanning line 12 and the control lines 143, 144 and 145) at a high density, and control lines with a narrower pitch are possible. As a result of this, a smaller electro-optical device (display section) and higher definition of display are possible.

Figure 15:
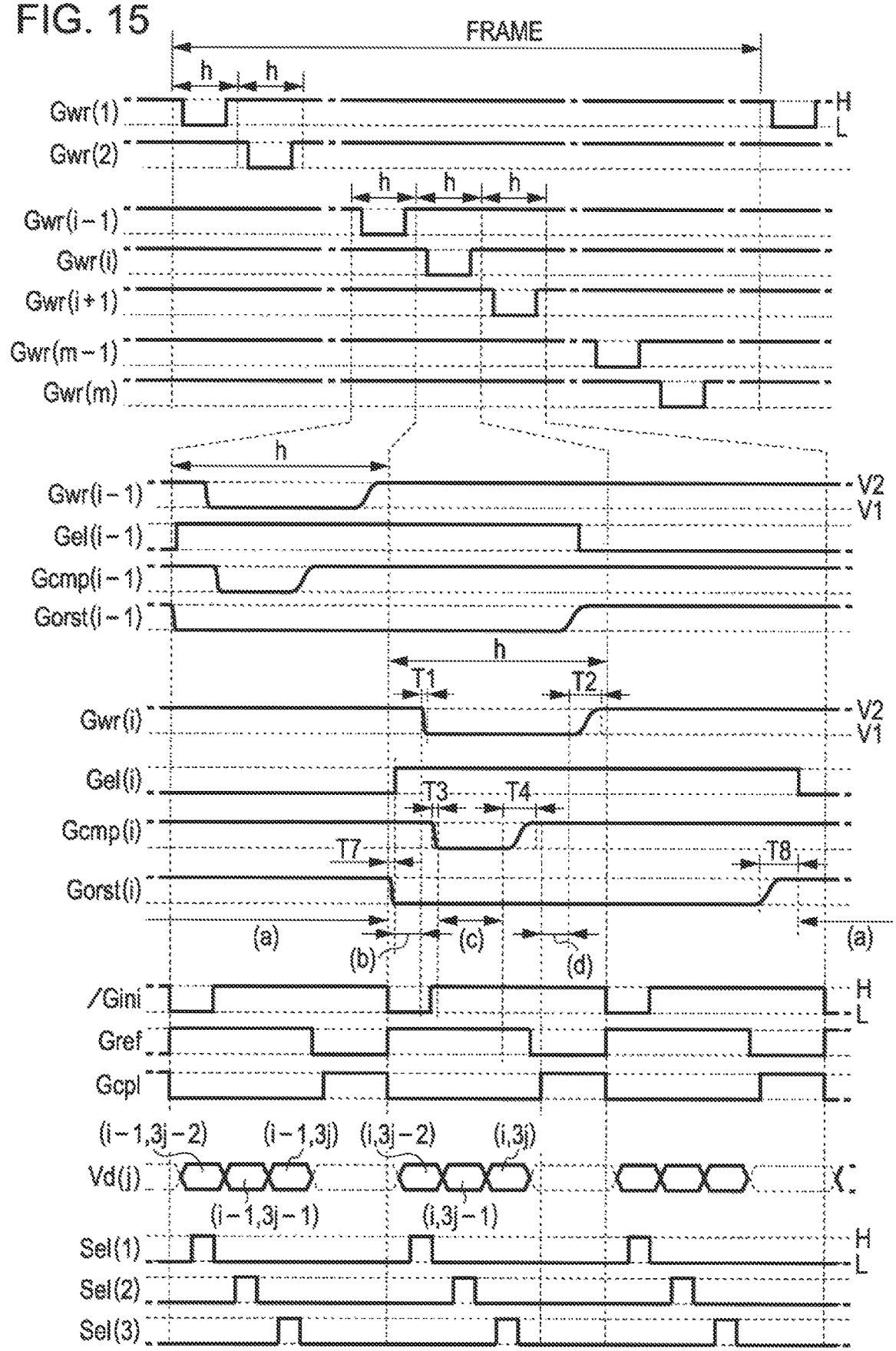
FIG. 15 is a timing chart that shows the operations of the same electro-optical device.

In addition, as shown in FIG. 15, in a case in which the control line 145 and the gate electrode G1 intersect, the scanning line drive circuit 20 may switch the potential that is supplied to the control line 145 so as to make the waveform when the control signal Gorst(i) is changed from an L level to an H level gradual in comparison with the change from an H level to an L level.

FIG. 15 is a timing chart for describing the operations of an electro-optical device according to modification example 2. As shown in FIG. 15, the scanning line drive circuit 20 according to modification example 2 changes the potential that is supplied to the control line 145 so that the duration of an eighth switching period T8, in which the potential that is supplied to the control line 145 is switched from the first potential V1 to the second potential V2, is sufficiently long in comparison with the duration of a seventh switching period T7, in which the potential is switched from the second potential V2 to the first potential V1. In this case, after the potential of the gate node g (the gate electrode G1) of the transistor 121 has been established as the potential Vgate that defines the brightness of the OLED 130, it is possible to accurately display each pixel with the gradation that defines the image signal Vid by preventing propagation of the fluctuations in potential in the control line 145 to the gate electrode G1.

Modification Example 3

In the abovementioned embodiment and modification examples, each pixel circuit 110 was provided with the transistors 121 to 125, the OLED 130 and the storage capacity 132, but the pixel circuit 110 may be provided with at least the transistor 121, the transistor 122 and the OLED 130. In this case, among the plurality of control lines that extend in the X direction (the scanning line 12 and the control lines 143, 144 and 145) provided in the display section 100 in the abovementioned embodiment and modification examples, the display section 100 may be provided with only those that correspond to the transistors that the pixel circuit 110 of modification example 3 is provided with in each row. That is, the display section 100 according to modification example 3 may be provided with one or more control lines that include the scanning line 12 in each row. For example, in a case in which the pixel circuit 110 is provided with the transistor 121, the transistor 122, the OLED 130 and the storage capacity 132, as the control lines that correspond to each row, only the scanning line 12 would be provided. In addition, each pixel circuit 110 may be provided with transistors other than the transistors 121 to 125, and in such a case, the display section 100 is provided with control lines that correspond to the transistors.

In a case in which one or more control lines that include the scanning line 12 are provided in each row, at least one control line among the 1 or more control lines that are provided in each row and extend in the X direction are provided to intersect the gate node g (gate electrode G1) of the transistor 121 in plan view. According to this configuration, it is possible to wire the control lines that extend in the X direction at a high density, a smaller electro-optical device (display section) and higher definition of display are possible.

Furthermore, in a case in which the scanning line drive circuit 20 changes the potential of at least one control line that intersects the gate electrode G1 in plan view from among the one or more control lines provided in each row in the interval from the end of the compensation period to the start of the subsequent scanning period, it is preferable that the waveform of the change in potential be gradual. For example, in a case in which the gate electrode G1 and the scanning line 12 intersect, the scanning line drive circuit 20 may change the potential that is supplied to the scanning line 12 so that the duration of the second switching period T2, in which the potential that is supplied to the scanning line 12 is switched from the first potential V1 to the second potential V2, is sufficiently long in comparison with the duration of the first switching period T1, in which the potential is switched from the second potential V2 to the first potential V1. According to this configuration, it is possible to prevent propagation of the change in the potential of the control line that intersects the gate electrode G1 to the gate electrode G1, and it is possible to accurately display each pixel with the gradation that defines the image signal Vid.

Furthermore, even in a case in which the scanning line drive circuit 20 changes the potential of the control line which is not to intersect the gate electrode G1 when viewed in plan view in the interval from the end of the compensation period to the start of the subsequent scanning period, the waveform of the change in potential may be gradual. Even in a case in which the control line is provided not to intersect the gate electrode G1, there is a parasitic capacity between the control line and the gate electrode G1. Accordingly, propagation of the change in potential of the control line to the gate electrode G1 can be prevented by making the waveform gradual when the potential of the control line changes.

Modification Example 4

In the abovementioned embodiment and modification examples, each level shift circuit LS is provided with a storage capacity 41, a storage capacity 44, a transistor 45, a transistor 43 and a transistor 42, but the level shift circuit LS may be provided with at least the storage capacity 44, the transistor 43 and the transistor 45. In this case, the data signal supply circuit 70 and the demultiplexer DM may supply the data signal Vd(j) to the second electrode of the storage capacity 44 in the write-in period.

Even in a case in which the level shift circuit LS is not provided with the storage capacity 41, the data signal Vd(j) that is supplied to the second electrode of the storage capacity 44 is supplied to the gate node g after being compressed by the capacity ratio k1. As a result of this, since it is even possible to set the potential of the gate node of the drive transistor with a fine degree of accuracy when the data signal is not recorded with a fine degree of accuracy, it is possible to supply the current to the light-emitting element with a high degree of accuracy and a high integrity display is possible.

Modification Example 5

In the abovementioned embodiment and modification examples, the data line drive circuit 10 is provided with the level shift circuit LS, the demultiplexer DM and the data signal supply circuit 70, but the data line drive circuit 10 may be provided with at least the data signal supply circuit 70. In this case the data line drive circuit 10 supplies the data signal Vd(j) to the gate node g directly.

Furthermore, in the abovementioned embodiment and modification examples, the display panel 2 is provided with a storage capacity 50 in each row, but the display panel 2 may be provided without this component.

Modification Example 6

In the abovementioned embodiment and modification examples, the control circuit 3 and the display panel 2 were separate entities, but the control circuit 3 and the display panel 2 may be formed on the same substrate. For example, the control circuit 3 may be integrated onto the silicon substrate in addition to the display section 100, the data line drive circuit 10, the scanning line drive circuit 20 and the like.

Modification Example 7

In the abovementioned embodiment and modification examples, the electro-optical device 1 had a configuration in which the foregoing was integrated onto a silicon substrate, but a configuration in which the electro-optical device 1 is integrated onto a different semiconductor substrate may be used. For example, an SOI substrate may be used. In addition, the electro-optical device 1 may be formed on a glass substrate or the like using a polysilicon process or the like. Regardless of the substrate used, the invention is effective in a configuration in which the pixel circuit 110 is miniaturized and the drain current in the transistor 121 is changed in an exponentially large manner with respect to the change in the gate voltage Vgs.

In addition, it is also possible to apply the invention in cases in which miniaturization of the pixel circuit is not required.

Modification Example 8

In the abovementioned embodiment and modification examples, a configuration in which the data lines 14 were grouped every three columns in addition to a data signal being supplied by selecting a data line 14 in each group in order, was used, but the number of data lines that configures a group may be a predetermined number that is "2" or more and "3n" or less. For example, the number of data lines that configures a group may be "2" and may be "4" or more.

In addition, a configuration without grouping, that is, a configuration in which the data signal is supplied to the data lines 14 of each column concurrently in line sequence without using a demultiplexer DM may be used.

Modification Example 9

In the abovementioned embodiment and modification examples, the transistors 121 to 125 in the pixel circuit 110 were all P-channel types, but the foregoing may all be N-channel types. In addition, a combination of P-channel types and N-channel types may be used as appropriate.

For example, in a case in which the transistors 121 to 125 are all N-channel types, the data signal Vd(j) in the abovementioned embodiment and modification examples may supply a potential in which the positive and negative polarities have been reversed to each pixel circuit 110. In addition, in this case, the sources and the drains of the transistors 121 to 125 have the opposite relationships to those in the abovementioned embodiment and modification examples.

In addition, in the abovementioned embodiment and modification examples, the transistor 45 was a P-channel type and the transistor 43 was an N-channel type, but the abovementioned transistors may both be P-channel types or N-channel types. Further, the transistor 45 may be an N-channel type and the transistor 43 may be a P-channel type.

In addition, in the abovementioned embodiment and modification examples, each transistor was a MOS-type transistor, but the foregoing may be a thin film transistor.

Modification Example 10

In the abovementioned embodiment and modification examples, an OLED that is a light-emitting element was exemplified as the electro-optical element, but for example, an inorganic light-emitting diode, and LED (Light Emitting Diode) or the like that emit light depending on a current.

Application Example

Next, an electronic apparatus in which the electro-optical device 1 according to the embodiment and the like and an application example will be described. The electro-optical device 1 is suited to an application in which pixels are displayed with at high definition with a small size. Considering this, description is made using a head-mounted display as an example of an electronic apparatus.

Figure 16:
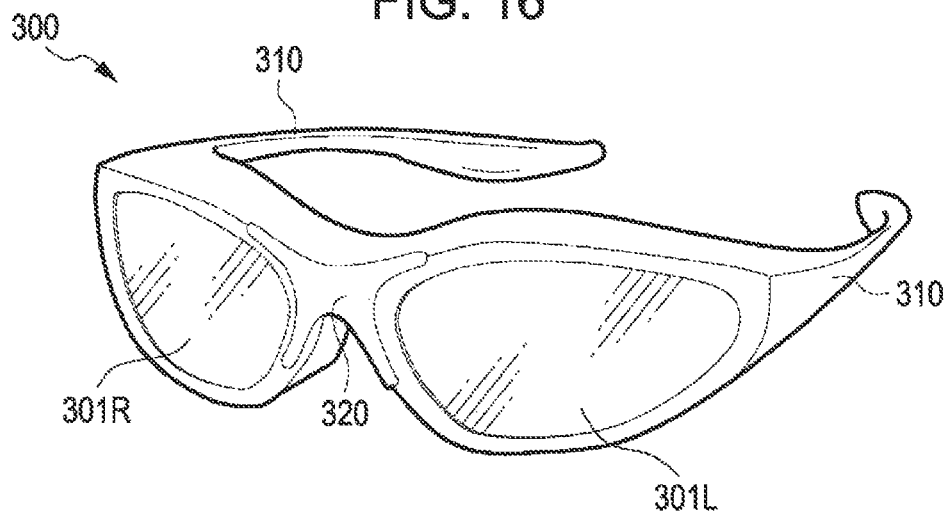
Figure 17:
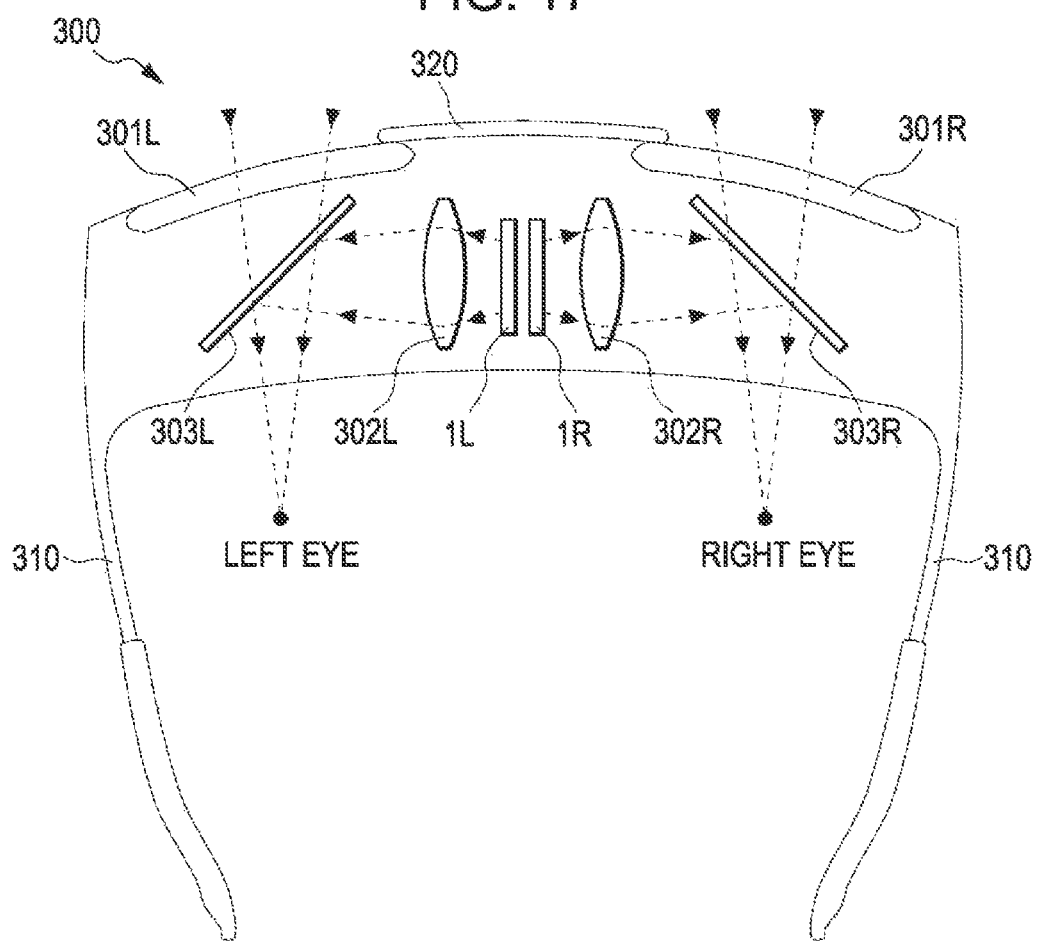
FIG. 17 is a view that shows the optical configuration of the HMD.

FIG. 16 is a perspective view that shows the exterior of a head-mounted display and FIG. 17 is a view that shows the optical configuration thereof.

Firstly, as shown in FIG. 16, the exterior of a head-mounted display 300 has a temple 310, a bridge 320, and lenses 301L and 301R in the same manner as a common pair of glasses. In addition, as shown in FIG. 17, the head-mounted display 300 is provided with a left eye electro-optical device 1L and a right eye electro-optical device 1R in the corner (the bottom in the drawing) of the lenses 301L and 301R that is in the vicinity of the bridge 320.

The image display screen of the electro-optical device 1L is disposed to be on the left side in FIG. 17. As a result of this, a display image that results from the electro-optical device 1L is output in the direction of 9 o'clock in the drawing through an optical lens 302L. A half mirror 303L reflects a display image that results from the electro-optical device 1L in the direction of 6 o'clock and allows light that enters from the direction of 12 o'clock to pass therethrough.

The image display screen of the electro-optical device 1R is disposed to be on the right side that is opposite the electro-optical device 1L. As a result of this, a display image that results from the electro-optical device 1R is output in the direction of 3 o'clock in the drawing through an optical lens 302R. A half mirror 303R reflects a display image that results from the electro-optical device 1R in the direction of 6 o'clock and allows light that enters from the direction of 12 o'clock to pass therethrough.

In this configuration, a user of the head-mounted display 300 can observe display images that result from the electro-optical devices 1L and 1R in a see-through state superimposed on an external state.

In addition, in this head-mounted display 300, among the images in both eyes that involve parallax, if the left eye image is displayed in the electro-optical device 1L and the right eye image is displayed in the electro-optical device 1R, it is possible for the user to perceive a displayed image as if the image had depth and a stereoscopic effect (3D display).

Additionally, in addition to a head-mounted display 300, the electro-optical device 1 may be used in electronic viewfinders in video cameras, digital cameras with interchangeable lenses and the like.

The entire disclosure of Japanese Patent Application No. 2012-084743, filed Apr. 3, 2012 is expressly incorporated by reference herein.

What is claimed is:

1. An electro-optical device comprising:
a feed line;
a light-emitting element that emits light corresponding to a current supplied via the feed line;
a control line that supplies a signal;
a capacitor that stores a potential;
a first transistor that has a first gate electrode electrically connected to the capacitor, the first transistor controlling the current corresponding to the potential;
a second transistor that has a second gate electrode electrically connected to the control line, the second transistor interrupting the current corresponding to the signal; and
a first insulating layer that has a first contact hole through which the second gate electrode and the control line are electrically connected, wherein
in plan view, the control line overlaps with the second gate electrode, and the first contact hole overlaps with the second gate electrode.

2. The electro-optical device according to claim 1 comprising:
a scanning line;
a data line that intersects the scanning line; and
a pixel circuit that is provided to correspond to an intersection of the scanning line and the data line, wherein
the pixel circuit includes the first transistor, the second transistor, and a third transistor that has a third gate electrode electrically connected to the scanning line, and
the third transistor electrically connects the first gate electrode and the data line.

3. The electro-optical device according to claim 2, wherein, in the plan view, the control line overlaps with two of the transistors included in the pixel circuit.

4. An electronic apparatus comprising the electro-optical device according to claim 3.

5. The electro-optical device according to claim 2 comprising
 the capacitor including a first capacitor electrode, wherein
  the capacitor is formed by the first gate electrode and the first capacitor electrode sandwiching the insulating layer.

6. An electronic apparatus comprising the electro-optical device according to claim 5.

7. An electronic apparatus comprising the electro-optical device according to claim 2.

8. An electronic apparatus comprising the electro-optical device according to claim 1.

* * * * *